(12) United States Patent
Shini

(10) Patent No.: US 12,101,933 B2
(45) Date of Patent: Sep. 24, 2024

(54) SEMICONDUCTOR DEVICE AND METHOD OF MANUFACTURING THE SAME

(71) Applicant: Kioxia Corporation, Tokyo (JP)

(72) Inventor: Masato Shini, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 285 days.

(21) Appl. No.: 17/472,202

(22) Filed: Sep. 10, 2021

(65) Prior Publication Data

US 2022/0302147 A1    Sep. 22, 2022

(30) Foreign Application Priority Data

Mar. 17, 2021  (JP) ................................. 2021-043718

(51) Int. Cl.
| | |
|---|---|
| *H10B 41/48* | (2023.01) |
| *H10B 41/10* | (2023.01) |
| *H10B 41/35* | (2023.01) |
| *H10B 41/50* | (2023.01) |
| *H10B 43/10* | (2023.01) |
| *H10B 43/35* | (2023.01) |
| *H10B 43/40* | (2023.01) |
| *H10B 43/50* | (2023.01) |

(52) U.S. Cl.
CPC ............. *H10B 41/48* (2023.02); *H10B 41/10* (2023.02); *H10B 41/35* (2023.02); *H10B 41/50* (2023.02); *H10B 43/10* (2023.02); *H10B 43/35* (2023.02); *H10B 43/40* (2023.02); *H10B 43/50* (2023.02)

(58) Field of Classification Search
CPC ........ H10B 41/10; H10B 41/35; H10B 41/48; H10B 41/50; H10B 43/10; H10B 43/30; H10B 43/35; H10B 43/40; H10B 43/50

USPC ......................................................... 257/341
See application file for complete search history.

(56) References Cited

U.S. PATENT DOCUMENTS

| | | |
|---|---|---|
| 2004/0137728 A1 | 7/2004 | Gallagher et al. |
| 2005/0205918 A1 | 9/2005 | Abiko |
| 2007/0155090 A1 | 7/2007 | Barth et al. |
| | (Continued) | |

FOREIGN PATENT DOCUMENTS

| | | |
|---|---|---|
| CN | 112310112 A | 2/2021 |
| JP | 2005-268551 A | 9/2005 |
| | (Continued) | |

*Primary Examiner* — Richard Elms
*Assistant Examiner* — Margaret B Hayes
(74) *Attorney, Agent, or Firm* — Foley & Lardner LLP

(57) ABSTRACT

A semiconductor device that can be downsized more than ever before is provided. A semiconductor device 10 includes: an insulating layer 21 provided on an upper side of a substrate 20; a conductor 110 provided within the insulating layer 21; a conductor 120 provided within the insulating layer 21 and facing the conductor 110 in a first direction parallel with a surface of the substrate 20; and an insulating film 130 provided between the conductor 110 and the conductor 120. A thickness of the insulating film 130 in the first direction is smaller than both of a thickness of the conductor 110 in the first direction and a thickness of the conductor 120 in the first direction. A relative permittivity of the insulating film 130 is higher than a relative permittivity of the insulating layer 21. The conductor 110 and the conductor 120 extend in a second direction intersecting the first direction and parallel with the substrate 20.

12 Claims, 25 Drawing Sheets

(56) References Cited

U.S. PATENT DOCUMENTS

| | | | |
|---|---|---|---|
| 2011/0073866 A1* | 3/2011 | Kim | H10B 43/27 |
| | | | 257/326 |
| 2015/0380480 A1 | 12/2015 | Ozawa et al. | |
| 2018/0315768 A1 | 11/2018 | Yamashita et al. | |
| 2021/0036009 A1 | 2/2021 | Jung et al. | |
| 2021/0384117 A1 | 12/2021 | Duan et al. | |

FOREIGN PATENT DOCUMENTS

| | | |
|---|---|---|
| JP | 4574145 B2 | 11/2010 |
| TW | 201606992 A | 2/2016 |
| TW | 201903974 A | 1/2019 |
| TW | 202147565 A | 12/2021 |

\* cited by examiner

*FIG. 23*
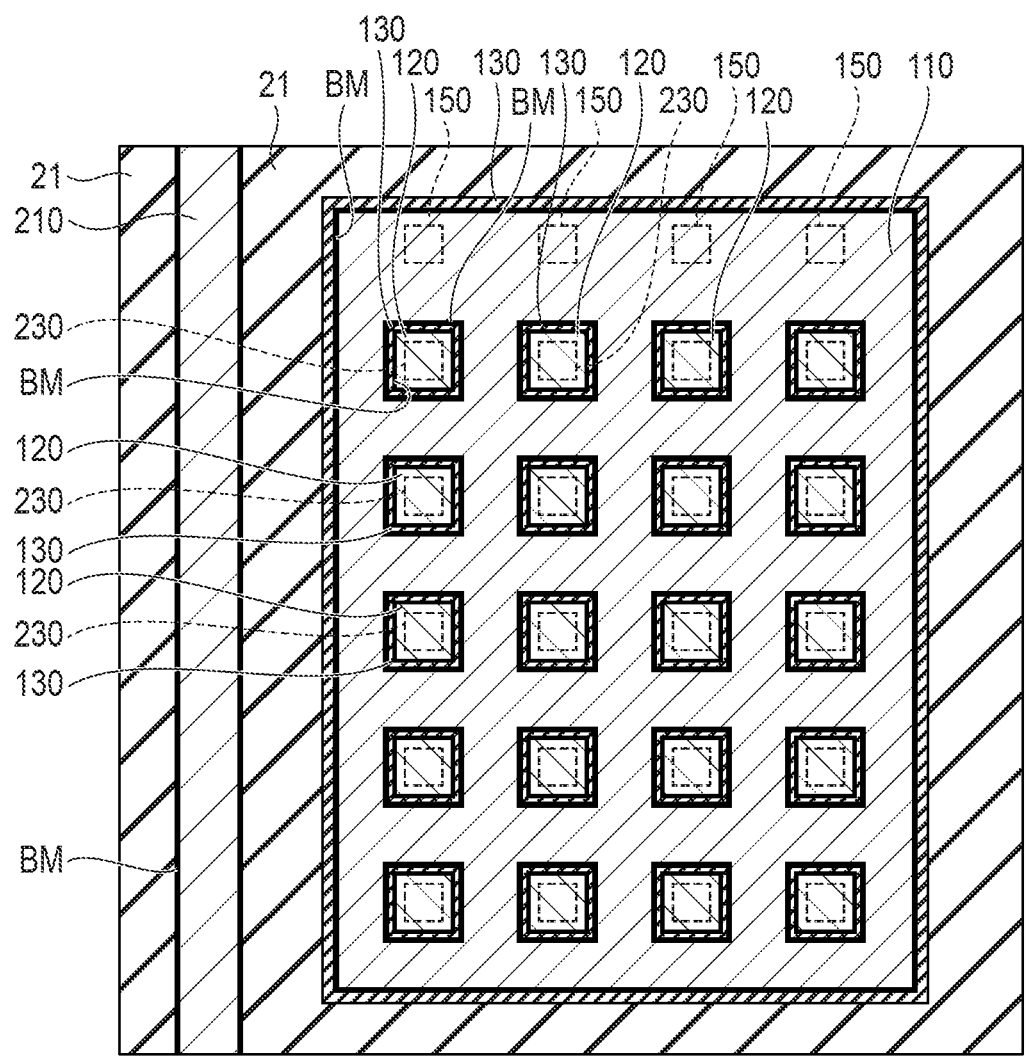
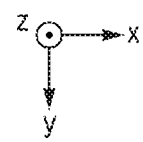

SEMICONDUCTOR DEVICE AND METHOD OF MANUFACTURING THE SAME

BACKGROUND OF THE INVENTION

Field of the Invention

An embodiment of the present invention relates to a semiconductor device and a method of manufacturing the semiconductor device.

Description of the Related Art

For example, in a semiconductor device such as a NAND flash memory, a circuit including a transistor, a capacitive element, and a wiring layer is formed inside an insulating layer covering a surface of a substrate.

CITATION LIST

Patent Literature

Patent Literature 1: Japanese Patent No. 4574145

The capacitive element included in the above-described circuit is required to have a certain size to ensure a capacitance as designed. In downsizing the semiconductor device, the form and location of the capacitive element is sometimes adverse to downsizing.

According to an embodiment as disclosed, a semiconductor device that can be downsized more than ever before is provided.

SUMMARY OF THE INVENTION

A semiconductor device according to an embodiment includes: an insulating layer provided on an upper side of a substrate; a first conductor provided within the insulating layer; a second conductor provided within the insulating layer and facing the first conductor in a first direction parallel with a surface of the substrate; and a first insulating film formed between the first conductor and the second conductor. A thickness of the first insulating film in the first direction is smaller than both of a thickness of the first conductor in the first direction and a thickness of the second conductor in the first direction. A relative permittivity of the first insulating film is higher than a relative permittivity of the insulating layer. The first conductor and the second conductor extend in a second direction intersecting the first direction and parallel with the substrate.

BRIEF DESCRIPTION OF THE DRAWINGS

FIG. 23 is a cross sectional view showing a configuration of a semiconductor device according to a third embodiment;

DETAILED DESCRIPTION OF THE PREFERRED EMBODIMENTS

Figure 1:
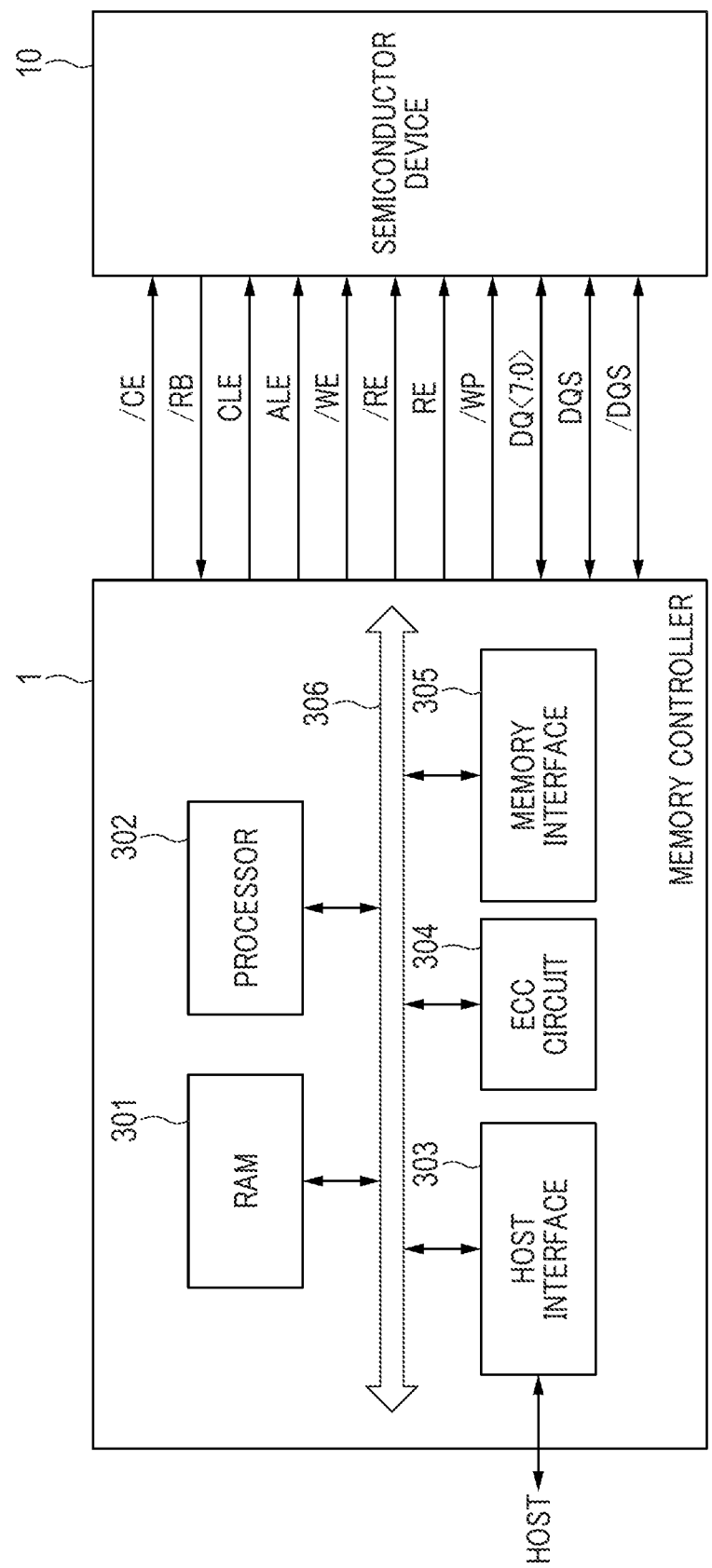
FIG. 1 is a block diagram showing a configuration example of a memory system according to a first embodiment.

Description will be made below on the present embodiments with reference to the attached drawings. In order to facilitate an understanding of the description, the same reference signs are used to refer to the same components in the drawings as much as possible and a redundant description will be omitted.

A first embodiment will be described. A semiconductor device 10 according to the present embodiment is a non-volatile storage configured as a NAND flash memory. In FIG. 1, a configuration example of a memory system including the semiconductor device 10 is shown as a block diagram. The memory system includes a memory controller 1 and the semiconductor device 10. It should be noted that the memory system in FIG. 1 actually includes a plurality of semiconductor devices 10, only one of which is shown in FIG. 1. A specific configuration of the semiconductor device 10 will be described later. The memory system is connectable to a host not shown. Examples of the host include electronic devices such as a personal computer and a mobile terminal.

The memory controller 1 controls writing of data to the semiconductor device 10 in accordance with a writing request from the host. The memory controller 1 also controls reading of data from the semiconductor device 10 in accordance with a reading request from the host.

Signals, such as a chip-enable signal /CE, a ready/busy signal /RB, a command-latch enable signal CLE, an address-latch enable signal ALE, a write enable signal /WE, read enable signals RE, /RE, and a write protect signal /WP, a signal DQ<7:0> that is data, data strobe signals DQS, /DQS, are to be transmitted and received between the memory controller 1 and the semiconductor device 10.

The chip-enable signal /CE is a signal for enabling the semiconductor device 10. The ready/busy signal /RB is a signal for indicating whether the semiconductor device 10 is in a ready state or in a busy state. The "ready state" refers to a state in which an external command is to be received. The "busy state" refers to a state in which no external command is to be received. The command-latch enable signal CLE is a signal indicating that a signal DQ<7:0> is a command. The address-latch enable signal ALE is a signal indicating that the signal DQ<7:0> is an address. The write enable signal /WE, which is a signal for taking a received signal into the semiconductor device 10, is to be asserted every time when the memory controller 1 receives a command, an address, and data. The memory controller 1 instructs the semiconductor device 10 to take the signal DQ<7:0> while the signal /WE is at a "L (Low)" level.

The read enable signals RE, /RE are signals for the memory controller 1 to read data from the semiconductor device 10. These are used for, for example, controlling an operation timing of the semiconductor device 10 for outputting the signal DQ<7:0>. The write protect signal /WP is a signal for providing instructions of inhibition of writing and erasure of data to the semiconductor device 10. The signal DQ<7:0> is an entity of data to be transmitted and received between the semiconductor device 10 and the memory controller 1, which includes a command, an address, and data. The data strobe signals DQS, /DQS are signals for controlling a timing for input and output of the signal DQ<7:0>.

The memory controller 1 includes RAM 301, a processor 302, a host interface 303, an ECC circuit 304, and a memory interface 305. The RAM 301, the processor 302, the host interface 303, the ECC circuit 304, and the memory interface 305 are connected to each other through an internal bus 306.

The host interface 303 outputs a request, user data (write data), etc., received from the host to the internal bus 306. The host interface 303 also transmits user data read from the semiconductor device 10, a response from the processor 302, etc., to the host.

The memory interface 305 controls, on the basis of instructions from the processor 302, a process of writing user data or the like to the semiconductor device 10 and a process of reading it from the semiconductor device 10.

The processor 302 collectively controls the memory controller 1. The processor 302 is, for example, a CPU or an MPU. The processor 302 performs, in response to receiving a request from the host through the host interface 303, a control in accordance with the request. For example, the processor 302 instructs the memory interface 305 to write user data and parity to the semiconductor device 10 in accordance with the request from the host. The processor 302 also instructs the memory interface 305 to read user data and parity from the semiconductor device 10 in accordance with the request from the host.

The processor 302 determines a storage region (a memory region) on the semiconductor device 10 for data accumulated in the RAM 301. The user data is held in the RAM 301 through the internal bus 306. The processor 302 determines the memory region for data (page data) per writing unit, i.e., per page. User data held in one page in the semiconductor device 10 is hereinafter also referred to as "unit data." The unit data is usually encoded and held in the semiconductor device 10 as a code word. In the present embodiment, encoding is not essential. Although the memory controller 1 may hold the unit data in the semiconductor device 10 without encoding the unit data, a configuration where encoding is performed is shown as a configuration example in FIG. 1. In a case where the memory controller 1 does not perform encoding, page data matches unit data. One code word may be generated on the basis of one piece of unit data or one code word may be generated on the basis of divided data provided by dividing unit data. Alternatively, one code word may be generated by using a plurality of unit data.

The processor 302 determines a writing destination, i.e., a memory region on the semiconductor device 10, for each unit data. Each memory region on the semiconductor device 10 is assigned with a physical address. With use of the physical address, the processor 302 manages the memory region, which is a destination for the unit data to be written. The processor 302 instructs the memory interface 305 to write the user data to the semiconductor device 10 with the determined memory region (physical address) designated. The processor 302 manages correspondence between a logical address (a logical address managed by the host) and the physical address of the user data. In a case of receiving a reading request including a logical address from the host, the processor 302 identifies the physical address corresponding to the logical address and instructs the memory interface 305 to read the user data with the physical address designated.

The ECC circuit 304 encodes user data held in the RAM 301, thereby generating a code word. The ECC circuit 304 also decodes a code word read from the semiconductor device 10.

The RAM 301 temporarily holds user data received from the host until the user data is stored in the semiconductor device 10 and temporarily holds data read from the semiconductor device 10 until the data is transmitted to the host. The RAM 301 is, for example, a general-purpose memory such as an SRAM or a DRAM.

FIG. 1 shows the configuration example where the memory controller 1 includes both the ECC circuit 304 and the memory interface 305. However, the ECC circuit 304 may be incorporated in the memory interface 305. Alternatively, the ECC circuit 304 may be incorporated in the semiconductor device 10. Specific configurations and locations of the components shown in FIG. 1 are not limitative.

In a case of receiving a writing request from the host, the memory system in FIG. 1 operates as follows. The processor 302 causes the RAM 301 to temporarily store data to write.

The processor 302 reads the data stored in the RAM 301 and inputs the data to the ECC circuit 304. The ECC circuit 304 encodes the input data and inputs a code word to the memory interface 305. The memory interface 305 writes the input code word to the semiconductor device 10.

In a case of receiving a reading request from the host, the memory system in FIG. 1 operates as follows. The memory interface 305 inputs a code word read from the semiconductor device 10 to the ECC circuit 304. The ECC circuit 304 decodes the input code word and causes the RAM 301 to store the decoded data. The processor 302 transmits the data stored in the RAM 301 to the host through the host interface 303.

Figure 2:
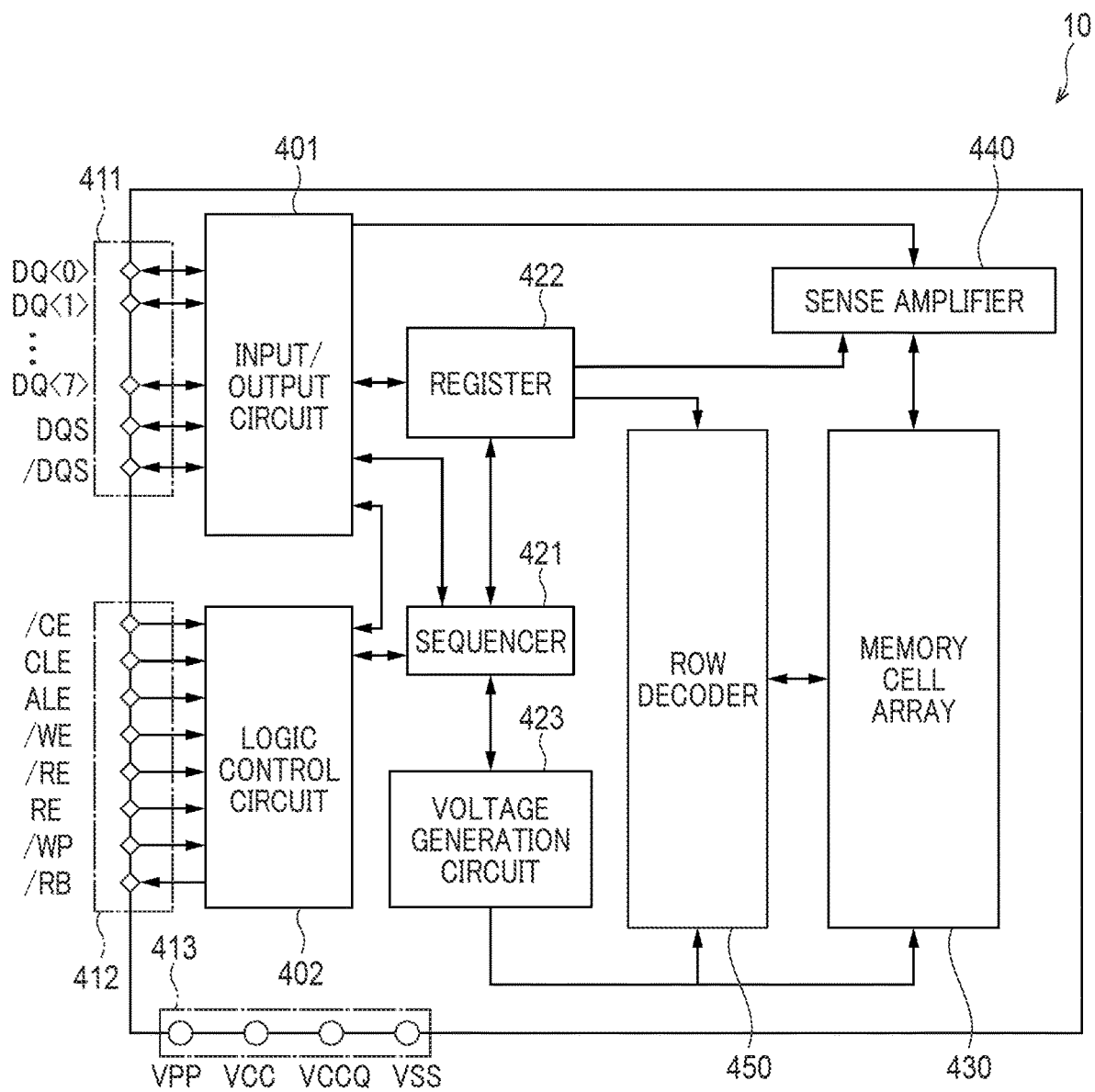
FIG. 2 is a block diagram showing a configuration of a semiconductor device according to the first embodiment.

A configuration of the semiconductor device 10 will be described. As shown in FIG. 2, the semiconductor device 10 includes a memory cell array 430, a sense amplifier 440, a row decoder 450, an input/output circuit 401, a logic control circuit 402, a sequencer 421, a register 422, a voltage generation circuit 423, a pad group for input/output 411, a pad group for logic control 412, and a terminal group for power input 413.

The memory cell array 430 is a section that stores data. The memory cell array 430 includes a plurality of memory cell transistors MT associated with a plurality of bit lines BL and a plurality of word lines WL. The memory cell transistors MT each function as a memory cell for storing information. A specific configuration of the memory cell array 430 will be described later with reference to FIG. 3 to FIG. 6.

The sense amplifier 440 is a circuit for adjusting a voltage to be applied to the bit lines BL and for reading the voltage of the bit lines BL and converting it to data. In reading data, the sense amplifier 440 acquires read data read from the memory cell transistors MT to the bit lines BL and forwards the acquired read data to the input/output circuit 401. In writing data, the sense amplifier 440 forwards write data, which is to be written through the bit lines BL, to the memory cell transistors MT. The operation of the sense amplifier 440 is controlled by the sequencer 421.

The row decoder 450 is a circuit configured as a switch group not shown for applying a voltage to each of the word lines WL. The row decoder 450 receives a block address and a row address from the register 422, selects a corresponding block on the basis of the block address and selects corresponding one of the word lines WL on the basis of the row address. The row decoder 450 switches opening and closing of the above-described switch group such that a voltage from the voltage generation circuit 423 is applied to the selected one of the word lines WL. The operation of the row decoder 450 is controlled by the sequencer 421.

The signal DQ<7:0> and the data strobe signals DQS, /DQS are transmitted and received between the input/output circuit 401 and the memory controller 1. The input/output circuit 401 forwards a command and an address in the signal DQ<7:0> to the register 422. In addition, write data and read data are transmitted and received between the input/output circuit 401 and the sense amplifier 440.

The logic control circuit 402 receives the chip-enable signal /CE, the command-latch enable signal CLE, the address-latch enable signal ALE, the write enable signal /WE, the read enable signals RE, /RE, and the write protect signal /WP from the memory controller 1. The logic control circuit 402 also forwards the ready/busy signal /RB to the memory controller 1, externally informing the state of the semiconductor device 10.

The sequencer 421 controls the operations of sections including the memory cell array 430 on the basis of a control signal input from the memory controller 1 to the input/output circuit 401 and the logic control circuit 402.

The register 422 is a section that temporarily holds a command and an address. The register 422 holds commands providing instructions for a writing operation, a reading operation, an erasure operation, and the like. The commands are input to the input/output circuit 401 from the memory controller 1 and then forwarded from the input/output circuit 401 to the register 422 to be held.

The register 422 also holds an address corresponding to the above-described command. The address is input to the input/output circuit 401 from the memory controller 1 and then forwarded from the input/output circuit 401 to the register 422 to be held.

The register 422 also holds status information indicating an operation state of the semiconductor device 10. The status information is updated by the sequencer 421 in accordance with an operation state of the memory cell array 430 or the like, if necessary. The status information is output as a state signal from the input/output circuit 401 to the memory controller 1 at the request of the memory controller 1.

The voltage generation circuit 423 is a section that generates a voltage required for each of operations for writing, reading, and erasing data in the memory cell array 430. Examples of such a voltage include a voltage to be applied to each of the word lines WL and a voltage to be applied to each of the bit lines BL. The operation of the voltage generation circuit 423 is controlled by the sequencer 421.

The pad group for input/output 411 is a section provided with a plurality of terminals (pads) for transmission and reception of the signals between the memory controller 1 and the input/output circuit 401. The terminals are individually provided corresponding one-to-one to the signal DQ<7:0> and the data strobe signals DQS, /DQS.

The pad group for logic control 412 is a section provided with a plurality of terminals (pads) for transmission and reception of the signals between the memory controller 1 and the logic control circuit 402. The terminals are individually provided corresponding one-to-one to the chip-enable signal /CE, the command-latch enable signal CLE, the address-latch enable signal ALE, the write enable signal /WE, the read enable signals RE, /RE, the write protect signal /WP, and the ready/busy signal /RB.

The terminal group for power input 413 is a section provided with a plurality of terminals for receiving application of voltages required for the operations of the semiconductor device 10. The voltages to be applied to the respective terminals include power source voltages Vcc, VccQ, and Vpp and a grounding voltage Vss.

The power source voltage Vcc, which is a circuit power source voltage externally given as an operation power source, is, for example, a voltage of 3.3 V, approximately. The power source voltage VccQ is, for example, a voltage of 1.2 V. The power source voltage VccQ is a voltage that is to be used for transmission and reception of a signal between the memory controller 1 and the semiconductor device 10. The power source voltage Vpp, which is a power source voltage higher than the power source voltage Vcc, is, for example, a voltage of 12 V.

Figure 3:
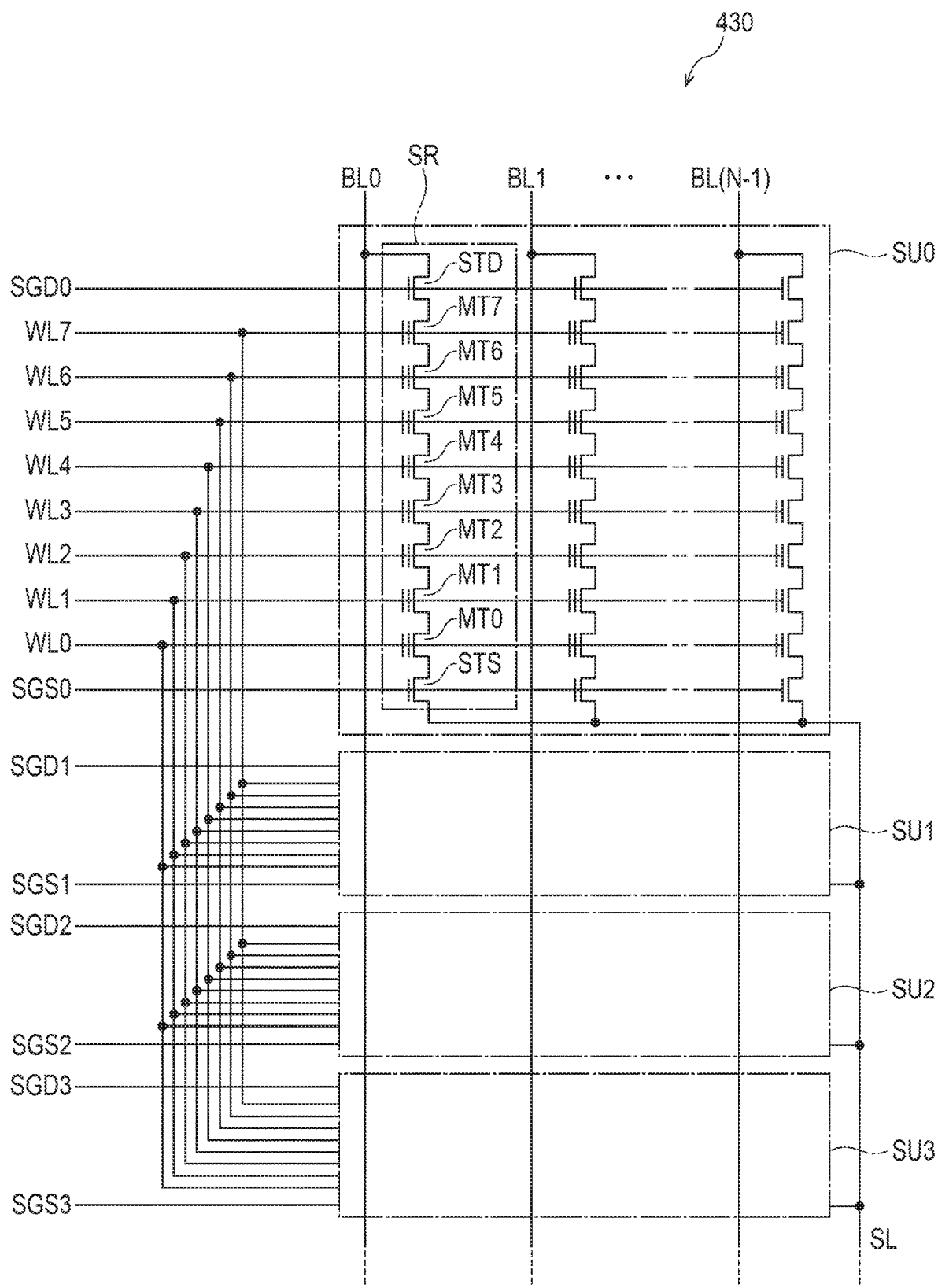
FIG. 3 shows an equivalent circuit in the semiconductor device according to the first embodiment.

A specific configuration of the memory cell array 430 will be described. FIG. 3 shows the configuration of the memory cell array 430 as an equivalent circuit diagram. As shown in the figure, the memory cell array 430 includes a plurality of string units SU0 to SU3. The string units SU0 to SU3 each include a plurality of NAND strings SR. The NAND strings SR each include, for example, eight memory cell transistors MT0 to MT7 and two select transistors STD and STS. The respective numbers of the memory cell transistors and the select transistors included in each of the NAND strings SR may be different from those in the example of FIG. 3.

The plurality of string units SU0 to SU3 are in the form of one block as a whole and the memory cell array 430 includes a plurality of such blocks. In FIG. 3, only a single block is shown and the other blocks are not shown.

In the description below, the string units SU0 to SU3 are sometimes also referred to as "string units SU" without distinction. Likewise, the memory cell transistors MT0 to MT7 are sometimes also referred to as "memory cell transistors MT" without distinction.

The string units SU each include the same number of NAND strings SR as bit lines BL0 to BL(N−1), the number of which is N. N is a positive integer. The memory cell transistors MT0 to MT7 included in the NAND string SR are arranged in series between a source of the select transistor STD and a drain of the select transistor STS. A drain of the select transistor STD is connected to one of the bit lines BL0, etc. A source of the select transistor STS is connected to a source line SL. In the description below, the bit lines BL1 to BL(N−1) are sometimes also referred to as "bit lines BL" without distinction.

As described later, the memory cell transistors MT are each configured as a transistor having a charge accumulation layer at a gate portion. The amount of charges accumulated in the charge accumulation layer corresponds to data held in the memory cell transistor MT. The memory cell transistors MT may each be a charge-trap transistor including, for example, a silicon nitride film as the charge accumulation layer or a floating gate transistor including, for example, a silicon film as the charge accumulation layer.

Gates of the plurality of select transistors STD included in the string unit SU0 are all connected to a select gate line SGD0. The select gate line SGD0 is a line to which a voltage for switching opening and closing of the select transistors STD is to be applied. As for the string units SU1 to SU3, there are likewise provided select gate lines SGD1 to SGD3, which correspond one-to-one to the string units SU, for applying a voltage to the select transistors STD.

Gates of the plurality of select transistors STS included in the string unit SU0 are all connected to a select gate line SGS0. The select gate line SGS0 is a line to which a voltage for switching opening and closing of each of the select transistors STS is to be applied. As for the string units SU1 to SU3, there are likewise provided select gate lines SGS1 to SGS3, which correspond one-to-one to the string units SU, for applying a voltage to the select transistors STS. It should be noted that the string units SU0 to SU3, which are in the form of one block, may share a select gate line SGS and the gates of all the select transistors STS included in the string units SU0 to SU3 may be connected to the select gate line SGS in common.

Gates of the memory cell transistors MT0 to MT7 are connected to word lines WL0 to WL7, respectively. The word lines WL0 to WL7 are lines to which a voltage is to be applied for the purpose of switching opening and closing of the memory cell transistors MT0 to MT7, changing the amount of charges accumulated in the respective charge accumulation layers of the memory cell transistors MT0 to MT7, or the like.

Writing and reading of data in the semiconductor device 10 are collectively performed for each unit referred to as a "page" on the plurality of memory cell transistors MT connected to one of the word lines WL in one of the string units SU. In contrast, erasure of data in the semiconductor device 10 is collectively performed on all the memory cell transistors MT included in the block. A variety of known methods are usable as specific methods for performing such writing, reading, erasure of data and, accordingly, the detailed description of the methods are omitted.

Figure 4:
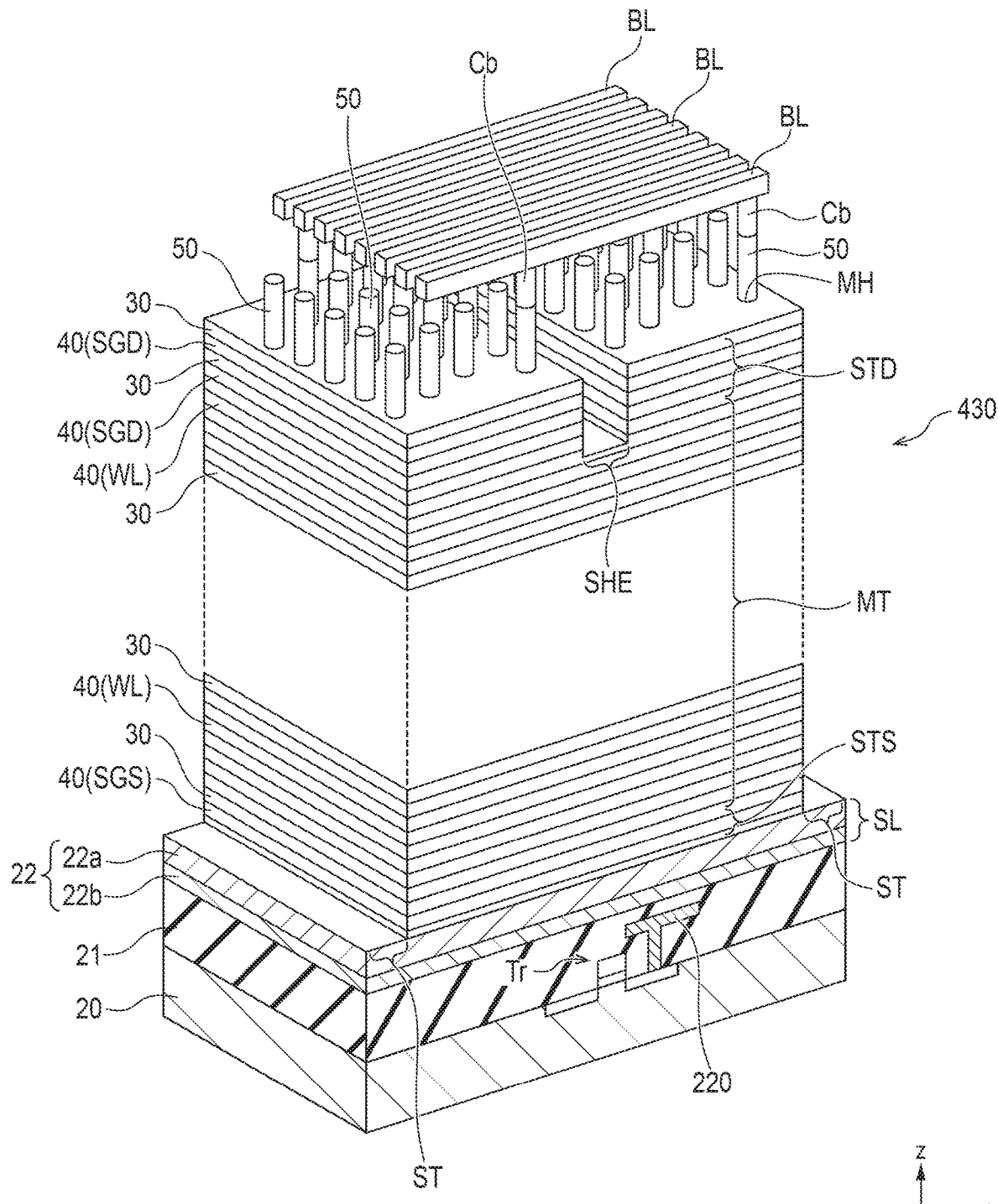
FIG. 4 shows the configuration of the semiconductor device according to the first embodiment.

FIG. 4 shows a schematic perspective view of a configuration of, in the semiconductor device 10, the memory cell array 430 and a portion in the vicinity thereof. As shown in the figure, the semiconductor device 10 includes a substrate 20, an insulating layer 21, a semiconductor layer 22, and a plurality of insulator layers 30 and conductor layers 40.

The substrate 20, which is a plate-shaped member having a flattened surface on a z-direction side in FIG. 4, is, for example, a silicon wafer. The insulating layer 21, the semiconductor layer 22, the insulator layers 30, the conductor layers 40, etc., as described below are in the form of a multi-layer film formed on a top-surface side of the substrate 20 by, for example, CVD film formation.

The insulating layer 21, which is, for example, a layer formed of an insulating material such as silicon oxide, is formed such that it covers a surface of the substrate 20. A peripheral circuit including, for example, a transistor Tr and a wiring line 220 is formed within the insulating layer 21. The transistor Tr is disposed on the surface of the substrate 20. The peripheral circuit, which provides the sense amplifier 440, the row decoder 450, etc., shown in FIG. 2, functions as a driver for driving the memory cells. The insulating layer 21 covers the whole of the peripheral circuit.

The semiconductor layer 22 is a layer that functions as the source line SL in FIG. 3. The semiconductor layer 22 is formed of, for example, a silicon-containing material such as a polycrystalline silicon doped with impurities. The semiconductor layer 22 is embedded in the above-described insulating layer 21 at a lower portion of the memory cell array 430.

It should be noted that although it may be formed of a semiconductor material such as silicon as a whole, the semiconductor layer 22 may have a double-layer structure including a semiconductor layer 22a and a conductive layer 22b as in the example in FIG. 4. The semiconductor layer 22a is, for example, a layer formed of a semiconductor material such as silicon. The conductive layer 22b is, for example, a layer formed of a metal material such as tungsten.

The plurality of insulator layers 30 and the plurality of conductor layers 40, which are formed on an upper side of the semiconductor layer 22, are alternately arranged side by side along a z-direction in FIG. 4.

The conductor layers 40 are conductive layers formed of, for example, a tungsten-containing material. The conductor layers 40 are individually used as the word lines WL0 to WL7, the select gate lines SGS0 and SGD0, etc., in FIG. 3. The insulator layers 30 are each disposed at a position between adjacent ones of the conductor layers 40, electrically insulating them from each other. The insulator layers 30 are formed of, for example, a silicon oxide-containing material.

A plurality of memory holes MH are formed in a region where the plurality of insulator layers 30 and conductor layers 40 are laminated in the z-direction, penetrating these layers in the z-direction. Memory pillars 50 are formed inside the memory holes MH. The memory pillars 50 are each formed in a range from the furthest one of the insulator layers 30 in the z-direction to the semiconductor layer 22. It should be noted that the memory pillars 50 correspond one-to-one to the NAND strings SR shown in FIG. 3.

Figure 5:
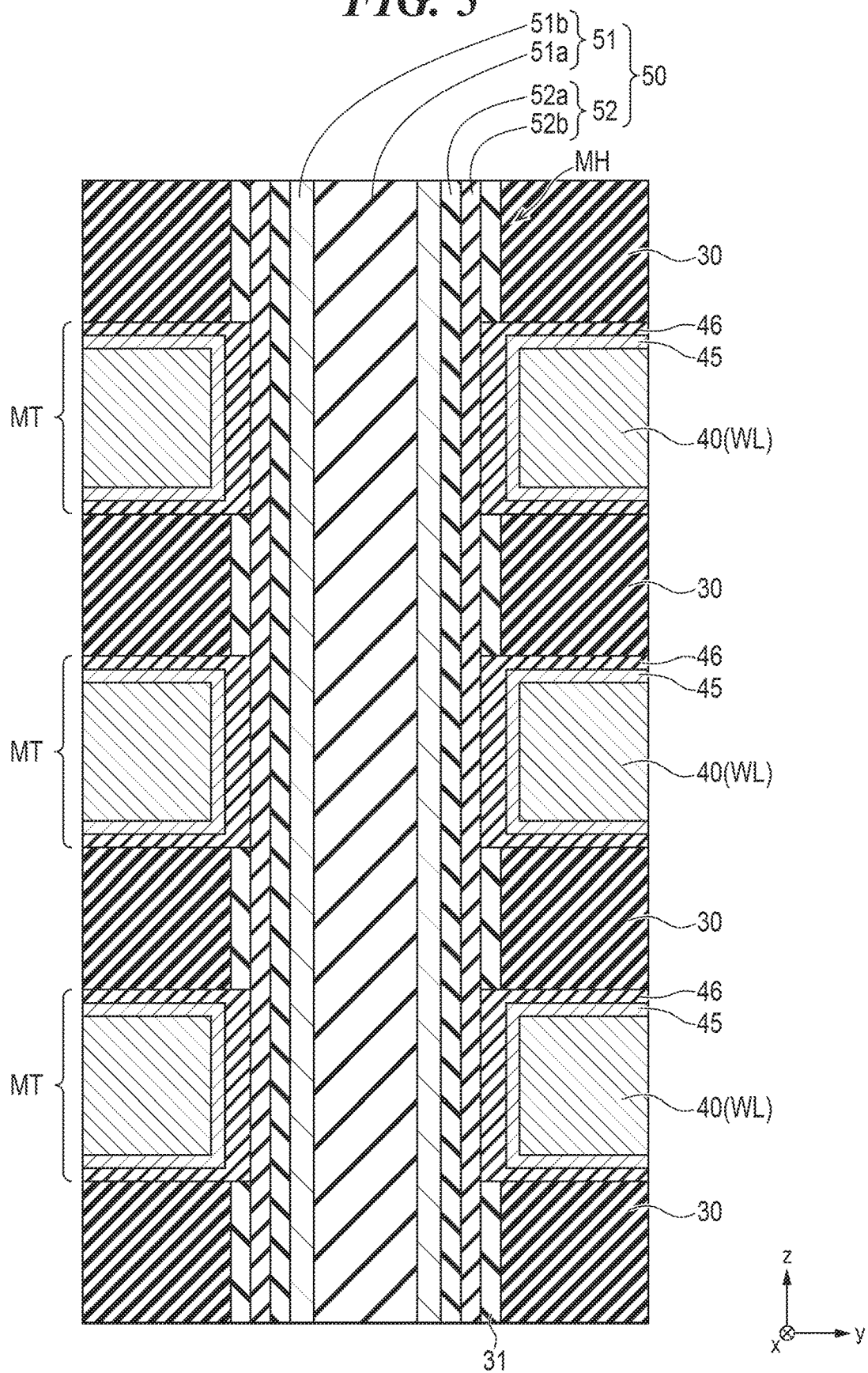
FIG. 5 is a cross sectional view showing the configuration of the semiconductor device according to the first embodiment.
Figure 6:
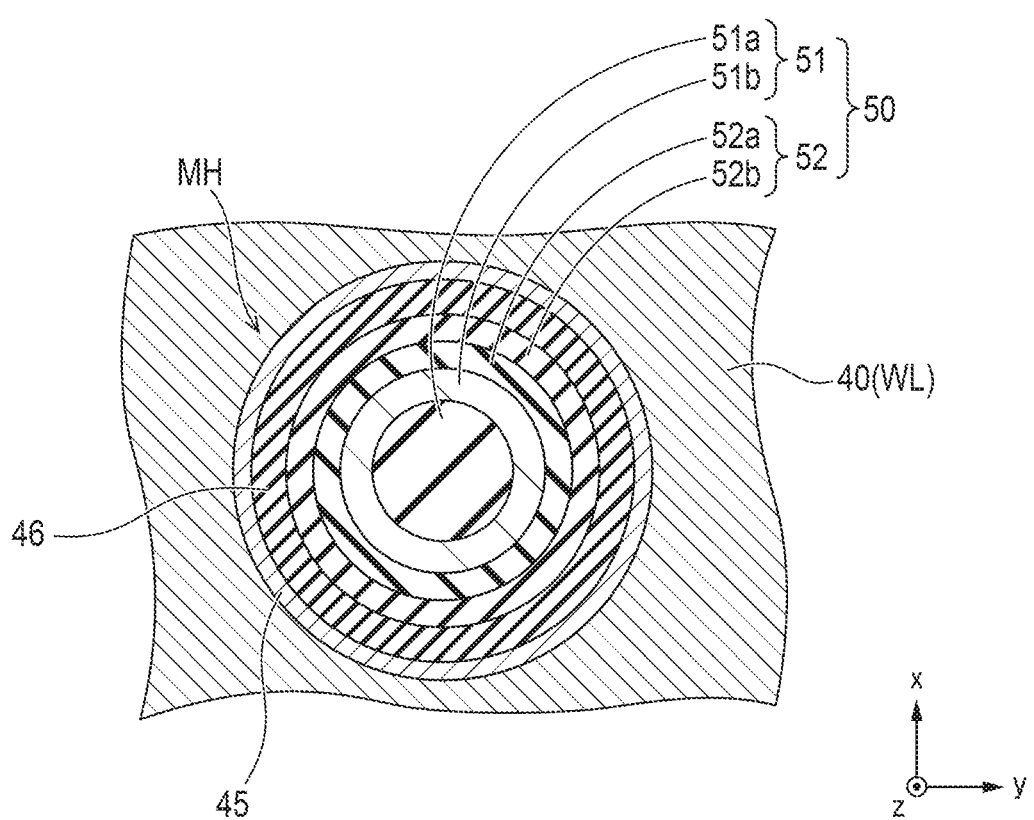
FIG. 6 is a cross sectional view showing the configuration of the semiconductor device according to the first embodiment.

FIG. 5 shows a cross section taken by cutting one of the memory pillars 50 along a plane (a y-z plane) passing through a center axis along a longitudinal direction of the memory pillar 50. FIG. 6 shows a cross section taken by cutting one of the memory pillars 50 along a plane (an x-y plane) perpendicular to the center axis of the memory pillar 50 and that passes through one of the conductor layers 40.

As shown in FIG. 6, the memory pillars 50 each have a circular or oval cross sectional shape. The memory pillars 50 each include body 51 and a film lamination 52.

The body 51 includes a core portion 51a and a semiconductor portion 51b. The semiconductor portion 51b, which is formed of, for example, a material including amorphous silicon, is a portion where channels of the memory cell transistors MT, etc., are formed. The core portion 51a, which is formed of, for example, an insulating material such as silicon oxide, is provided inside the semiconductor portion 51b. It should be noted that the body 51 may be provided by the semiconductor portion 51b as a whole without the inner core portion 51a inside.

The film lamination 52 is in the form of a multi-layer film formed such that it covers an outer periphery of the body 51. The film lamination 52 includes, for example, a tunnel insulating film 52a and a charge trap film 52b. The tunnel insulating film 52a is a film formed innermost. The tunnel insulating film 52a contains, for example, silicon oxide or silicon oxide and silicon nitride. The tunnel insulating film 52a is a potential barrier between the body 51 and the charge trap film 52b. For example, in injecting electrons from the body 51 into the charge trap film 52b (the writing operation) and in injecting holes from the body 51 into the charge trap film 52b (the erasure operation), the electrons and the holes both pass (tunnel) through the potential barrier, i.e., the tunnel insulating film 52a.

The charge trap film 52b is a film formed such that it covers an outside of the tunnel insulating film 52a. The charge trap film 52b, which contains, for example, silicon nitride, has a trap site where charges are to be trapped in the film. Portions of the charge trap film 52b sandwiched between the word lines WL, i.e., the conductor layers 40, and the body 51 provide storage regions of the memory cell transistors MT as the charge accumulation layers described above. A threshold voltage of the memory cell transistors MT varies with whether or not charges are in the charge trap film 52b or the amount of the charges. The memory cell transistors MT thus hold information.

As shown in FIG. 5, the word lines WL, i.e., the conductor layers 40, each have an outer peripheral surface covered with a barrier film 45 and a block insulating film 46. The barrier film 45 is a film for improving adhesion between the conductor layer 40 and the block insulating film 46. In a case where the conductor layers 40 contain, for example, tungsten, a laminated structure film of titanium nitride and titanium is selected as the barrier film 45.

The block insulating film 46 is a film for reducing back tunneling of charges from the conductor layer 40 toward the film lamination 52. The block insulating film 46 is, for example, a silicon oxide film or a metal oxide film. One example of the metal oxide is aluminum oxide.

A cover insulating film 31 is provided between the insulator layers 30 and the charge trap film 52b. The cover insulating film 31 contains, for example, silicon oxide. The cover insulating film 31 is a film for protecting the charge trap film 52b from being etched during a replacement step of replacing sacrifice layers with the conductor layers 40. In a case where the replacement step is not used to form the conductor layers 40, no cover insulating film 31 may be provided.

As described above, in each of the memory pillars 50, inside of portions connected to the respective conductor layers 40 function as transistors. In other words, in each of the memory pillars 50, a plurality of transistors are connected in series along the longitudinal direction of the memory pillar 50. The conductor layers 40 are connected to gates of the respective transistors through the film lamination 52. The semiconductor portion 51b inside the transistors functions as channels of the transistors.

The transistors arranged in series as described above along the longitudinal direction of each of the memory pillars 50 partly function as the plurality of memory cell transistors MT in FIG. 3. Further, the transistors formed on both sides of the plurality of memory cell transistors MT arranged in series function as the select transistors STD and STS in FIG. 3.

Referring back to FIG. 4, the description will be continued. The plurality of bit lines BL are provided on an upper side of each of the memory pillars 50 as shown in the figure. The bit lines BL are each in the form of a linear wiring line extending in an x-direction in FIG. 4, being arranged side by side along a y-direction in the figure. Upper ends of the memory pillars 50 are connected to the bit lines BL through contacts Cb. This causes the semiconductor portions 51b of the memory pillars 50 to be electrically connected to the bit lines BL.

The laminated conductor layers 40 and insulator layers 30 are divided by a slit ST. The slit ST, which is a linear groove formed to extend along the y-direction in FIG. 4, is formed deep sufficient to reach, for example, the semiconductor layer 22.

An upper portion of the laminated conductor layers 40 and insulator layers 30 is divided by a slit SHE. The slit SHE is a shallow groove formed such that it extends along the y-direction in FIG. 4. The slit SHE is formed deep sufficient to divide only one of the plurality of conductor layers 40 that is provided as the select gate line SGD.

At a lower end portion of each of the memory pillars 50, from which the film lamination 52 is removed, the semiconductor portion 51b is connected to the semiconductor layer 22. This causes the semiconductor layer 22, which functions as the source line SL, to be electrically connected to the channels of the transistors.

The peripheral circuit disposed within the insulating layer 21 includes a capacitive element 100 in addition to the transistor Tr, etc., shown in FIG. 4. The capacitive element 100 functions as, for example, a capacitor for adjusting a time constant of a change in potential at a specific node.

Configurations of sections will also be described hereinafter with reference to the x-direction, the y-direction, and z-direction shown in FIG. 4. The z-direction is a direction from down to up, in which the plurality of conductor layers 40 are laminated. The z-direction is a direction perpendicular to the surface of the substrate 20. The x-direction is a direction intersecting the z-direction, in which the bit lines BL extend. The y-direction is a direction intersecting both the z-direction and the x-direction, in which the plurality of bit lines BL are arranged side by side. The x-direction and the y-direction are both parallel with the surface of the substrate 20.

Figure 7:
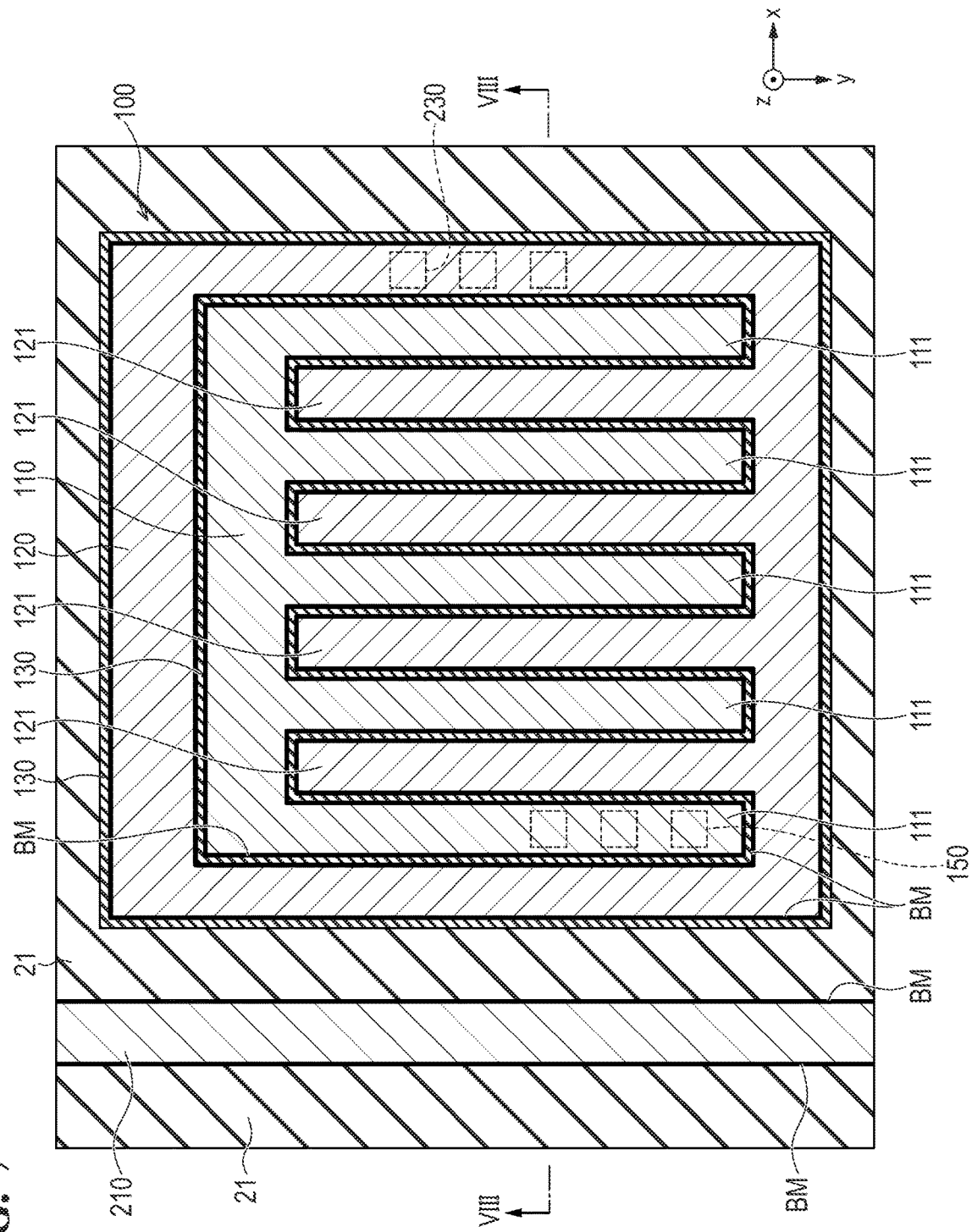
FIG. 7 is a cross sectional view showing the configuration of the semiconductor device according to the first embodiment.
Figure 8:
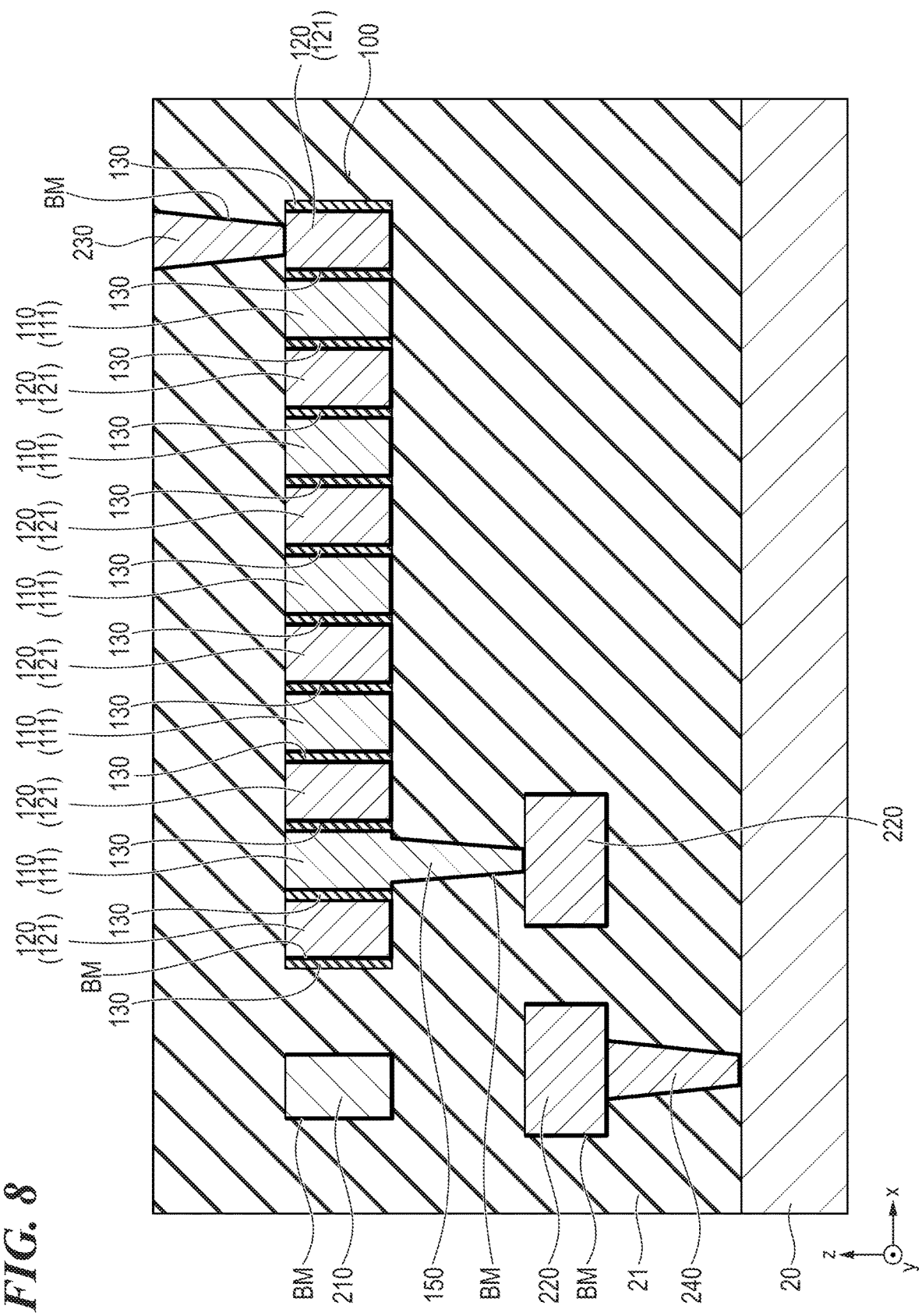
FIG. 8 shows a cross section along VIII-VIII in FIG. 7.

Referring to FIG. 7 and FIG. 8, description will be made on a configuration of the capacitive element 100. FIG. 7 shows a cross section taken by cutting the capacitive element 100 and a portion in the vicinity thereof along the x-y plane parallel with the surface of the substrate 20. FIG. 8 shows a cross section along VIII-VIII in FIG. 7. The capacitive element 100 includes a pair of conductors 110 and 120 and an insulating film 130. In addition, a linear conductor 210 extending in the y-direction is provided in the vicinity of the capacitive element 100. The conductor 210 is a conductor provided as the wiring layer constituting a part of the peripheral circuit.

The capacitive element 100 is disposed within the insulating layer 21 as described above. A distance in the z-direction between the substrate 20 and the memory cells is thus larger than a distance in the z-direction between the substrate 20 and the conductor 110.

The conductors 110 and 120 are both formed of a conductive material. The material may be, for example, a metal material such as tungsten. The material of the conductor 110 and the material of the conductor 120 may be the same as each other or different from each other.

As shown in FIG. 7, the conductor 110 has a plurality of linear portions 111 linearly extending toward a y-direction side and the plurality of linear portions 111 are formed such that they are arranged side by side in the x-direction. Likewise, the conductor 120 has a plurality of linear portions 121 linearly extending toward a −y-direction side and the plurality of linear portions 121 are formed such that they are arranged side by side in the x-direction. The linear portions 111 of the conductor 110 and the linear portions 121 of the conductor 120 face each other in the x-direction, being alternately arranged side by side along the same direction.

The whole of the conductor 110, including the linear portions 111, is disposed at a position inside the conductor 120 in a top view. The insulating film 130 is formed to fill a space between the conductor 110 and the conductor 120, which are adjacent to each other. In other words, the insulating film 130 is in contact with both the conductor 110 and the conductor 120. The insulating film 130 is a film formed of an insulting material. For example, a material with a relatively high relative permittivity such as hafnium oxide, tantalum oxide, or silicon nitride is usable as the material of the insulating film 130. By virtue of such a configuration, the capacitive element 100 functions as a capacitor. The insulating film 130 may contain another material in addition to one of the above-described materials.

It is preferable that a material with a relative permittivity higher than that of the insulating layer 21 be used as the material of the insulating film 130. However, in a case where a sufficient capacitance of the capacitive element 100 can be ensured, the insulating film 130 may be formed of the same material as the insulating layer 21 (for example, silicon oxide).

It should be noted that in the present embodiment, the insulating film 130 is formed not only between the conductor 110 and the conductor 120 but also on an outer peripheral side of the conductor 120 due to a later-described manufacturing method. The insulating film 130 corresponds to a "first insulating film" according to the present embodiment.

A part of an outer peripheral surface of the conductor 110 and a part of an outer peripheral surface of the conductor 120 are covered with a barrier metal BM. In FIG. 7 and FIG. 8, cross sections of the portions covered with the barrier metal BM are shown by thick lines. The barrier metal BM is a conductive thin film formed for the purpose of preventing the material of the conductors 110 and 120 from reacting with a surrounding member or from being diffused around. For example, titanium or titanium nitride is usable as a material of the barrier metal BM.

The conductor 110, including the barrier metal BM covering the part of the outer peripheral surface thereof, corresponds to a "first conductor" according to the present embodiment. Likewise, the conductor 120, including the barrier metal BM covering the part of the outer peripheral surface thereof, corresponds to a "second conductor" according to the present embodiment.

Portions of the conductor 110 (the first conductor) and the conductor 120 (the second conductor) shown in FIG. 8 both extend along the y-direction. The y-direction corresponds to a "second direction" according to the present embodiment.

In the cross section in the FIG. 8, a thickness of the conductor 110 in the z-direction is larger than a minimum distance between the conductor 110 and the conductor 120. The "minimum distance" herein refers to, for example, the shortest one of distances between adjacent ones of the linear portions 111 and the linear portions 121 in the x-direction in the cross section in FIG. 8.

As shown in FIG. 8, one end of a contact 150, which extends from below, is connected to the conductor 110. The other end of the contact 150 is connected to the wiring line 220 constituting the peripheral circuit. One end of a contact 230, which extends from above, is connected to the conductor 120. The other end of the contact 230 is connected to a wiring line, which is not shown, constituting the peripheral circuit. Both the contacts 150 and 230, which are provided as vias for electrically connecting the capacitive element 100 and surrounding wiring lines, extend in a direction perpendicular to the surface of the substrate 20 (i.e., the z-direction). It should be noted that in the example in FIG. 8, the two wiring lines 220 are provided below the capacitive element 100. One of the wiring lines 220 is connected to the conductor 110 through the contact 150 as described above, whereas the other is connected to the substrate 20 through a contact 240.

The contact 150 is formed integrally with the conductor 110 by, for example, a dual damascene method. The contact 230 is likewise formed integrally with the wiring line not shown thereabove. Outer peripheral surfaces of the contacts 150 and 230 are covered with the barrier metal BM. The contact 150, etc., may be formed by any other method such as a single damascene method.

A position of an end portion of the contact 150 toward the substrate 20 is closer to the substrate 20 than a position of an end portion of the conductor 120 (the second conductor) toward the substrate 20. In other words, the contact 150 extends to a position further below a lower end of the conductor 120.

As described above, the semiconductor device 10 according to the present embodiment includes the insulating layer 21 provided on the upper side of the substrate 20, the conductor 110 (the first conductor) provided within the insulating layer 21, the conductor 120 (the second conductor) provided within the insulating layer 21 and facing the conductor 110 in the direction parallel with the surface of the substrate 20 (for example, the x-direction in FIG. 8), and the insulating film 130 (the first insulating film) provided between the conductor 110 and the conductor 120; and the conductor 110, the conductor 120, and the insulating film 130 provide the capacitive element 100. The x-direction, in which the insulating layer 21 and the conductor 120 face each other, corresponds to a "first direction" according to the present embodiment. It should be noted that the insulating layer 21 may directly cover the surface of the substrate 20 as in the present embodiment or may indirectly cover the surface of the substrate 20 with, for example, another film in between.

The insulating film 130 is a considerably thin film formed on a side surface of the conductor 110 by a later-described method. Thus, a thickness of the insulating film 130 in a direction in which the conductor 110, the insulating film 130, and the conductor 120 are arranged side by side (the x-direction in FIG. 8) is smaller than both of a thickness of the conductor 110 in that direction and a thickness of the conductor 120 in that direction as shown in FIG. 8.

A capacitance C of the capacitive element 100 can be calculated by an expression (1) below.

$$C = \varepsilon_r \varepsilon_0 \times S/d = \varepsilon_r \varepsilon_0 \times (L \times H)/d \qquad (1)$$

In the expression (1), $\varepsilon_r$ denotes a relative permittivity of the insulating film 130 and $\varepsilon_0$ denotes a permittivity of vacuum. S denotes a surface area of the whole of a portion of the conductor 110 facing the conductor 120. d denotes the thickness of the insulating film 130. L denotes a length of the whole of the portion of the conductor 110 facing the conductor 120 in a top view as in FIG. 7. H denotes a height of the portion of the conductor 110 facing the conductor 120 (i.e., a dimension along the z-direction).

To downsize a dimension of the semiconductor device 10 as a whole, it is preferable that the capacitance of the capacitive element 100 per unit of area be increased as much as possible by increasing the value of the capacitance C in the expression (1). In the present embodiment, the insulating film 130 is formed as a thin film disposed perpendicularly to the surface of the substrate 20, thereby reducing the value of d in the expression (1) more than ever before. This increases the capacitance of the capacitive element 100 per unit of area, making it possible to downsize the semiconductor device 10 including the capacitive element 100.

Further, in the present embodiment, the plurality of linear portions 111 and linear portions 121 are in an alternately arranged form as shown in FIG. 7, which increases the value of L in the expression (1). For example, the value of L is further increased with a further reduction in an arrangement pitch of the linear portions 111 and the linear portions 121 as compared with that in the configuration in FIG. 7 and, consequently, the value of the capacitance C is further increased. As seen from the above, the semiconductor device 10 can be further downsized by adjusting the form of the conductor 110 and the conductor 120.

In addition, in the present embodiment, a material with a relative permittivity higher than that of the insulating layer 21 is used as the material of the insulating film 130, which increases the value of $\varepsilon_r$ in the expression (1). This makes it possible to further downsize the semiconductor device 10.

$\varepsilon_r$, d, L, and H in the expression (1) are parameters for adjusting the capacitance C of the capacitive element 100. These are individually adjustable as parameters independent of each other and, accordingly, may be set as appropriate in accordance with the value of the capacitance required of the capacitive element 100.

Figure 25:
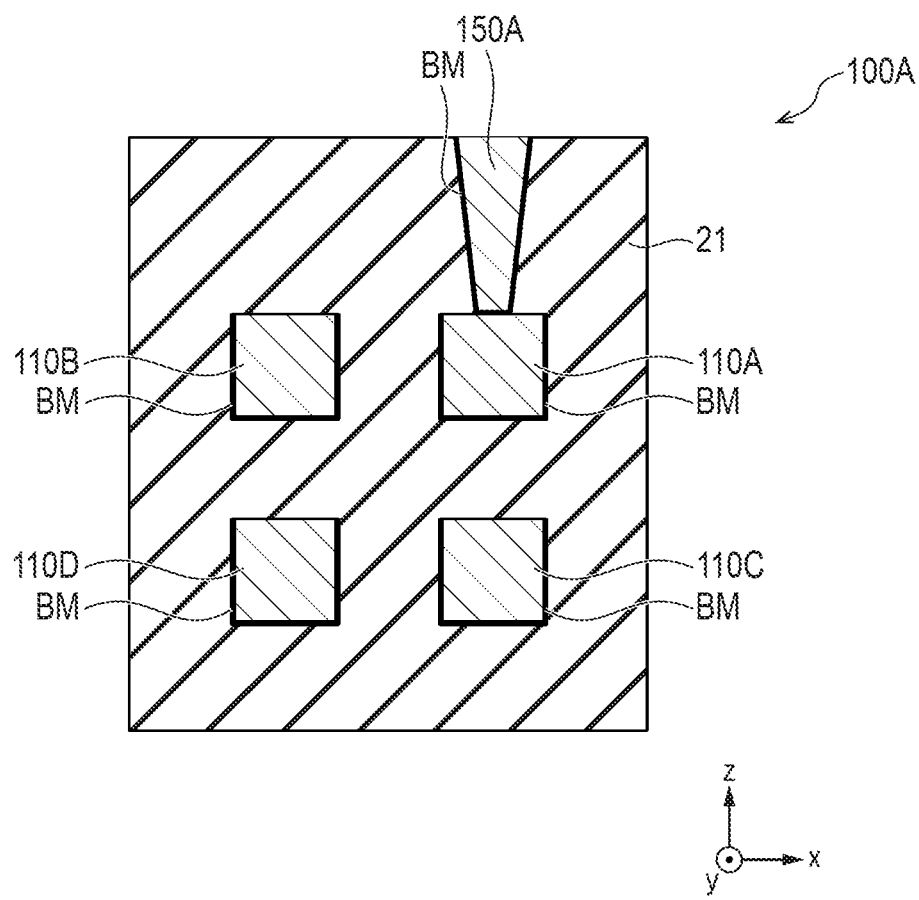
FIG. 25 is a cross sectional view schematically showing a configuration of a semiconductor device according to a comparative example.

FIG. 25 schematically illustrates a configuration of a capacitive element 100A according to a comparative example. Conductors 110A, 110B, 110C, and 110D shown in the figure are all formed, as wiring lines of a peripheral circuit, within the insulating layer 21, extending in the y-direction in FIG. 25. In the comparative example, a part of the conductor 110A, etc., routed as the wiring lines is also used as the capacitive element 100A. It should be noted that in the example in FIG. 25, a contact 150A is connected to the conductor 110A from above; however, a position where the contact 150A is provided may be different from the position shown in FIG. 25.

In such a configuration, for example, a capacitance component between the conductors 110A and 110C, which face each other along an up-down direction, is usable as the capacitive element 100A. In this case, in order to increase a capacitance per unit of area, it is necessary to reduce a distance between the conductors 110A and 110C. However, if the distance between the conductors 110A and 110C, which are also used as wiring lines, is excessively reduced, a capacitance between conductors that intersect each other while being adjacent to each other at a portion different from the range shown in FIG. 25 becomes too large to ignore, which would make the peripheral circuit likely to fail to operate as designed. Further, the conductor 110A, which is an upper-layer wiring line, and the conductor 110C, which is a lower-layer wiring line, are formed by lithography at respective different timings, so that a position offset along, for example, the x-direction sometimes occurs between the conductors 110A and 110C. As a result, an offset of a capacitance of the capacitive element 100A from a designed value is also of concern.

In contrast, in the present embodiment, the capacitive element 100 is provided as a separate component independent of the wiring lines of the peripheral circuit, so that a reduction in the distance between the conductor 110 and the conductor 120 does not increase a capacitance between conductors at any other portion. Further, by virtue of the insulating film 130 and the conductor 120 being formed by the later-described method, it is possible to reduce a variation in capacitance attributed to a position offset caused at the time of formation.

It should be noted that examples of a configuration where a pair of conductors that provide the capacitive element 100A are arranged side by side in the up-down direction as in the above-described comparative example possibly include a configuration where plate-shaped conductors (electrodes) parallel with the surface of the substrate 20 face each other in the up-down direction as in, for example, a MOS capacitor. However, in this case, an area of face-to-face portions of the vertically disposed conductors directly determines an area of the capacitive element 100A in a top view. As a result, the area of the capacitive element 100A in the top view becomes considerably large with a capacitance per unit of area reduced. In contrast, in the present embodiment, the insulating film 130 is formed as a thin film disposed in a plane perpendicular to the surface of the substrate 20, so that the area of the capacitive element 100 in a top view is prevented from being large even though the area of the face-to-face portions of the conductors 110 and 120 is increased.

For example, a capacitance component between the conductors 110A and 110B, which face each other along a right-left direction, is also usable as the capacitive element 100A in FIG. 25. In this case, in order to increase a capacitance per unit of area, it is also necessary to reduce a distance between the conductors 110A and 110B. However, it is difficult to reduce the distance between the conductors 110A and 110B, which depends on a pattern accuracy of lithography, in the same manner as the insulating film 130 in the present embodiment, so that the distance becomes comparable with a width of the conductor 110A or the like (a dimension along the x-direction in FIG. 25).

In contrast, in the present embodiment, the insulating film 130 is formed by the later-described method, which enables the insulating film 130 to be formed as a considerably thin film. As a result, the thickness of the insulating film 130 in the direction in which the conductor 110, the insulating film 130, and the conductor 120 are arranged side by side can be smaller than both of the thickness of the conductor 110 in that direction and the thickness of the conductor 120 in that direction as described above.

In the cross section in FIG. 8, the conductor 120 is provided at both sides of the conductors 110 along the x-direction with the insulating film 130 in between. With one of the plurality of linear portions 111 shown in the cross section in FIG. 8 focused on, the linear portions 121 of the conductor 120 disposed on both sides of the linear portion 111 correspond to a "first portion" and a "second portion" according to the present embodiment, respectively. The linear portions 121 (i.e., the first portion and the second portion) between which the linear portion 111 is sandwiched both extend in the y-direction, being adjacent to each other with the linear portion 111 sandwiched in between in the x-direction.

A portion of the insulating film 130 disposed between the above-described first portion and linear portion 111 corresponds to a "third portion" according to the present embodiment. A portion of the insulating film 130 disposed between the above-described second portion and linear portion 111 corresponds to a "fourth portion" according to the present embodiment.

A thickness of the third portion in the x-direction is smaller than both of a thickness of the linear portion 111 in the x-direction and a thickness of the first portion in the x-direction. A thickness of the fourth portion in the x-direction is smaller than both of the thickness of the linear portion 111 in the x-direction and a thickness of the second portion in the x-direction.

Description will be made below on a method of manufacturing the semiconductor device 10, in particular, on a method of forming the capacitive element 100 and a surrounding portion thereof.

Figure 9:
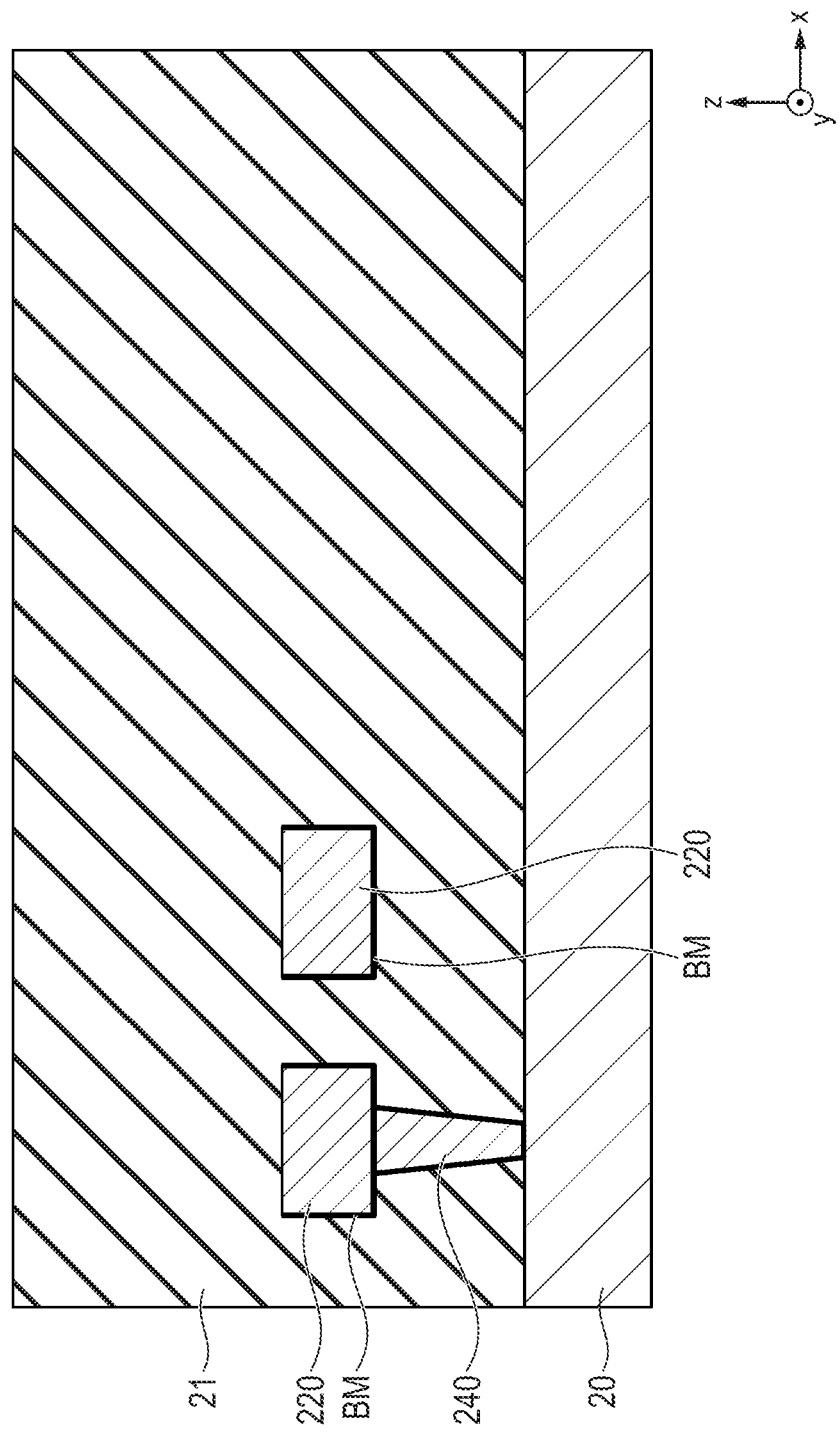
FIG. 9 is a diagram of assistance in explaining a method of manufacturing the semiconductor device according to the first embodiment.

<Insulating Layer Formation Step> In the first step, that is, an insulating layer formation step, circuit elements that constitute the peripheral circuit, such as the transistor Tr shown in FIG. 4, are first formed on the surface of a silicon wafer, that is, the substrate 20. Subsequently, the insulating layer 21, which covers the surface of the substrate 20, and the wiring lines 220, the contact 240, etc., embedded in the insulating layer 21 are formed through steps such as CVD film formation and lithography. FIG. 9 shows a state where the insulating layer formation step has been completed. In FIG. 9, the circuit elements such as the transistor Tr formed on the surface of the substrate 20 are not shown. It should be noted that in the insulating layer formation step, not the whole of the final insulating layer 21 shown in FIG. 4 but only a part excluding an upper portion is formed.

As described above, the insulating layer formation step is a step of forming the insulating layer 21 on the upper side of the substrate 20. It should be noted that the insulating layer 21 formed in the insulating layer formation step is not the whole of the insulating layer 21 shown in FIG. 8 but only a part thereof. The part of the insulating layer 21 formed in the insulating layer formation step corresponds to the "first portion" according to the present embodiment.

Figure 10:
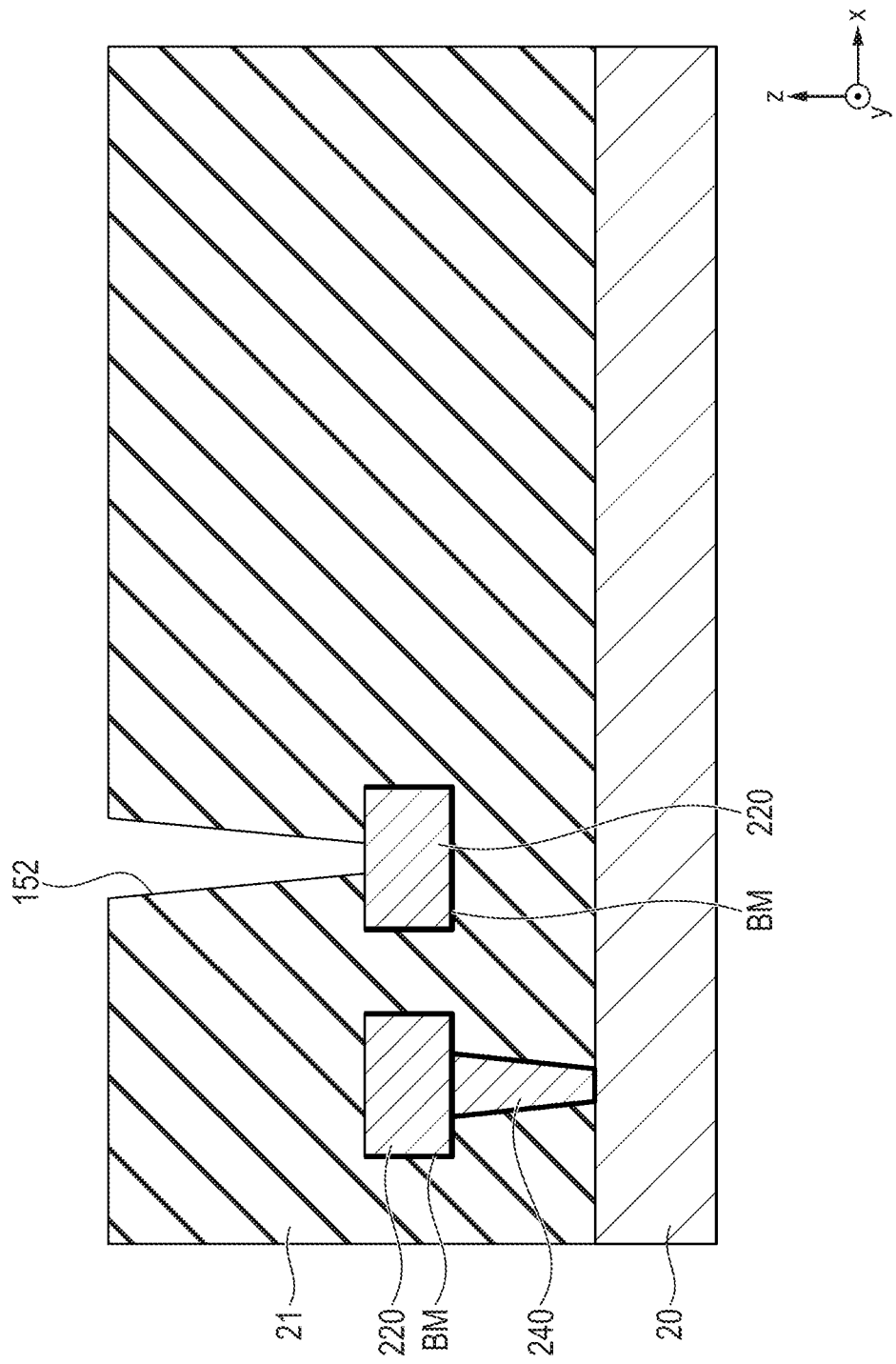
FIG. 10 is a diagram of assistance in explaining the method of manufacturing the semiconductor device according to the first embodiment.

<Recessed Portion Formation Step> In a recessed portion formation step subsequent to the insulating layer formation step, for example, a contact hole 152 is formed in the insulating layer 21 by RIE (Reactive Ion Etching). As shown in FIG. 10, the contact hole 152, which is a hole extending along the z-direction, is formed such that it reaches one of the wiring lines 220. The contact hole 152 is a hole in which the contact 150 (see FIG. 8) is to be formed in a subsequent step.

Figure 11:
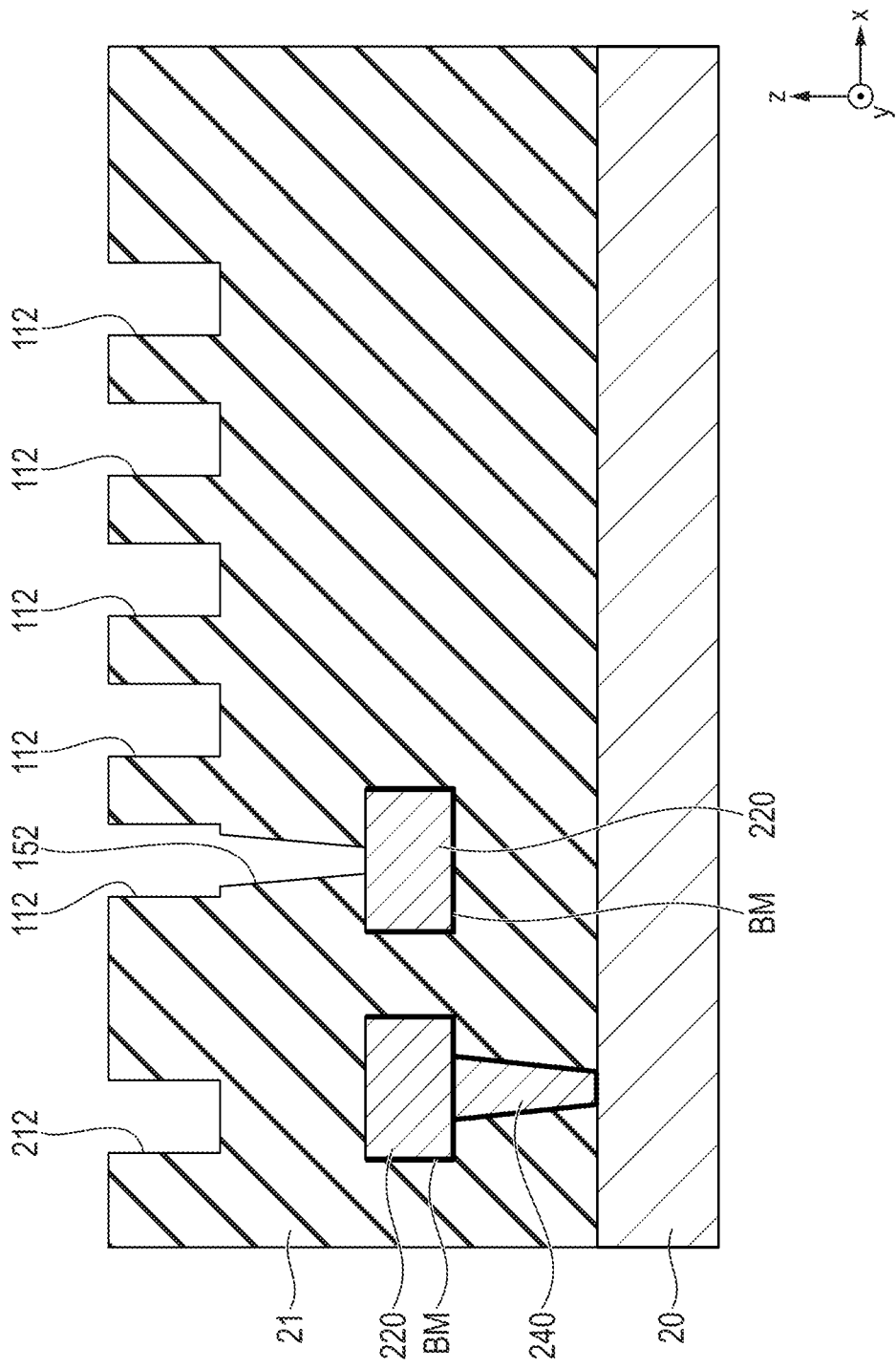
FIG. 11 is a diagram of assistance in explaining the method of manufacturing the semiconductor device according to the first embodiment.

After the contact hole 152 is formed, RIE is further performed to form recessed portions 112 and a recessed portion 212 in a top surface of the insulating layer 21. FIG. 11 shows a state where the recessed portion formation step has been completed. A range where the recessed portions 112 are formed is a range where the conductor 110 in FIG. 7 is formed in a top view. The recessed portions 112 shown in a cross section in FIG. 11 correspond one-to-one to portions where the linear portions 111 are formed in FIG. 8. As shown in FIG. 11, with the recessed portion formation step completed, one of the recessed portions 112 is in communication with the contact hole 152 having been formed.

A range where the recessed portion 212 is formed is a range where the conductor 210 in FIG. 7 is formed in a top view. In the present embodiment, the recessed portions 112 corresponding to the conductor 110 in FIG. 7 and the recessed portion 212 corresponding to the conductor 210 in FIG. 7 are simultaneously formed by, for example, RIE as described above. The recessed portions 112 and the recessed portion 212 are thus formed at the same level as each other.

Figure 12:
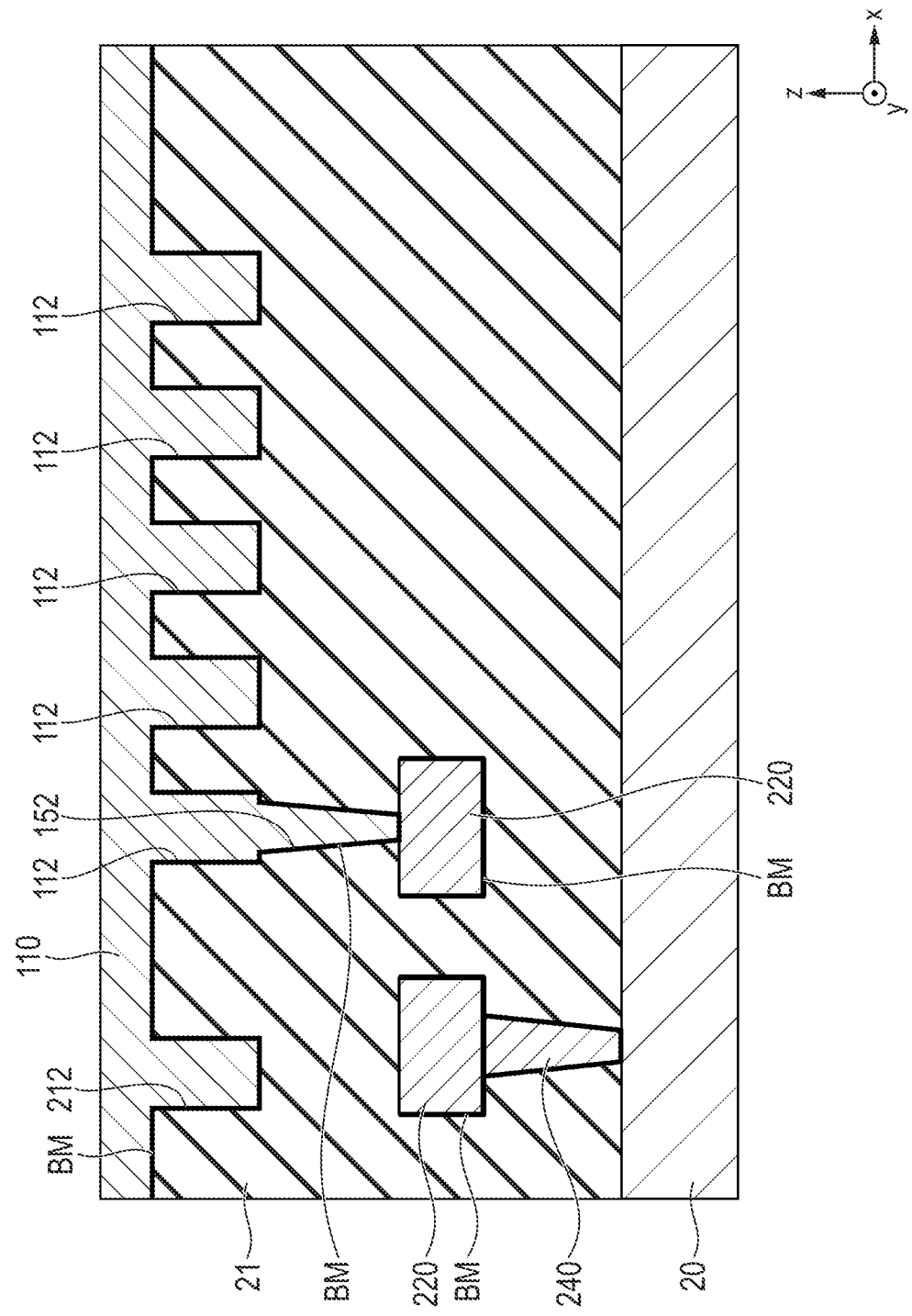
FIG. 12 is a diagram of assistance in explaining the method of manufacturing the semiconductor device according to the first embodiment.

<First Conductor Formation Step> In a first conductor formation step subsequent to the recessed portion formation step, a layer of the barrier metal BM is first formed such that it covers the whole surface of the insulating layer 21 including the recessed portions 112, the recessed portion 212, etc. Then, a layer of the conductor 110 is formed such that it covers the whole of the barrier metal BM. The barrier metal BM and the conductor 110 are formed by, for example, CVD. FIG. 12 shows a state where the first conductor formation step has been completed. As shown in the figure, with the first conductor formation step completed, the inside of the contact hole 152, the recessed portions 112, and the recessed portion 212 is fully filled with the conductor 110 with the barrier metal BM in between. The conductor 110 with which the inside of the recessed portions 112 is filled finally remains as the conductor 110 shown in FIG. 7, etc. The conductor 110 with which the inside of the recessed portion 212 is filled finally remains as the conductor 210 shown in FIG. 7, etc. The conductor 110 with which the inside of the contact hole 152 is filled finally becomes the contact 150. The first conductor formation step, which is a step of simultaneously forming the conductor 110 and the contact 150 therebelow as described above, is performed by a conventional dual damascene method.

As described above, the first conductor formation step is a step of forming the conductor 110 (the first conductor) within the insulating layer 21.

Figure 13:
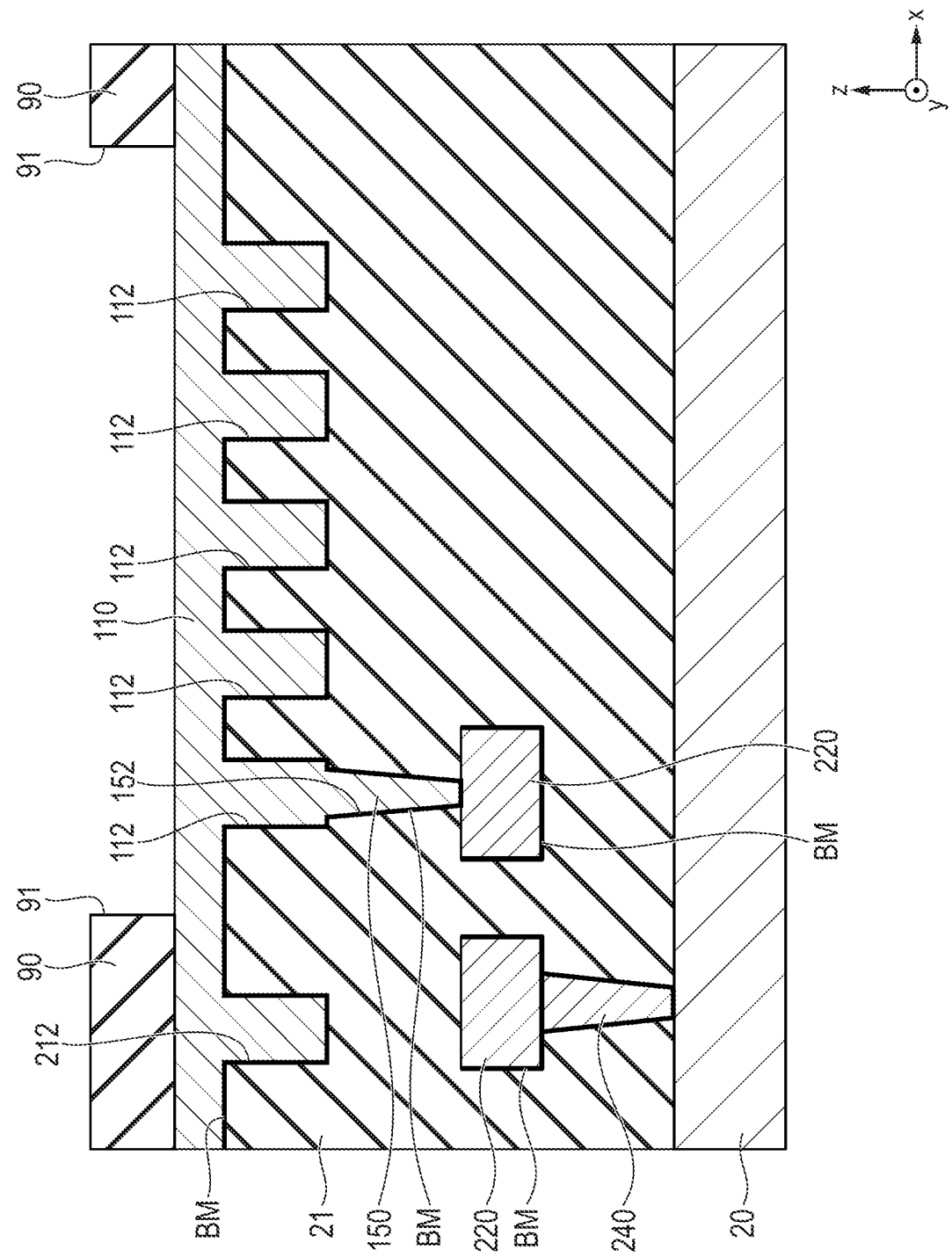
FIG. 13 is a diagram of assistance in explaining the method of manufacturing the semiconductor device according to the first embodiment.

<Mask Formation Step> In a mask formation step subsequent to the first conductor formation step, an etching mask 90 is formed such that it covers a surface of the conductor 110. Then, an opening 91 is formed at a part of the etching mask 90. FIG. 13 shows a state where the mask formation step has been completed. As shown in the figure, the opening 91 is formed over a range directly above a portion where the capacitive element 100 is formed in FIG. 8. A portion directly above the recessed portion 212 is covered with the etching mask 90.

Figure 14:
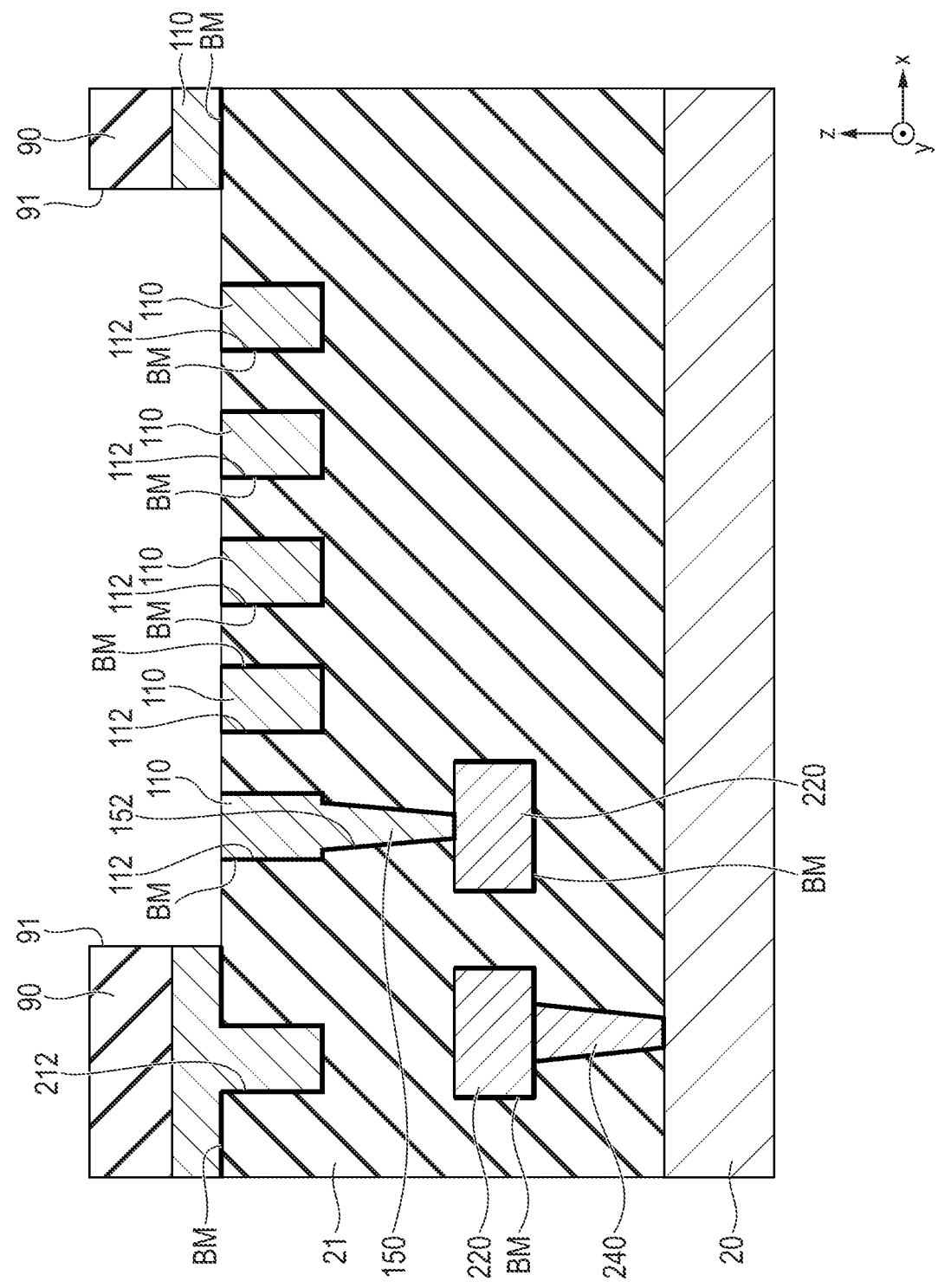
FIG. 14 is a diagram of assistance in explaining the method of manufacturing the semiconductor device according to the first embodiment.

<Exposure Step> In an exposure step subsequent to the mask formation step, a part of the conductor 110 exposed in the opening 91 is removed by anisotropic etching through the etching mask 90. As shown in FIG. 14, the etching is performed until the surface of the insulating layer 21 becomes exposed. The inside of the recessed portions 112 and the recessed portion 212 remains filled with the conductor 110.

Figure 15:
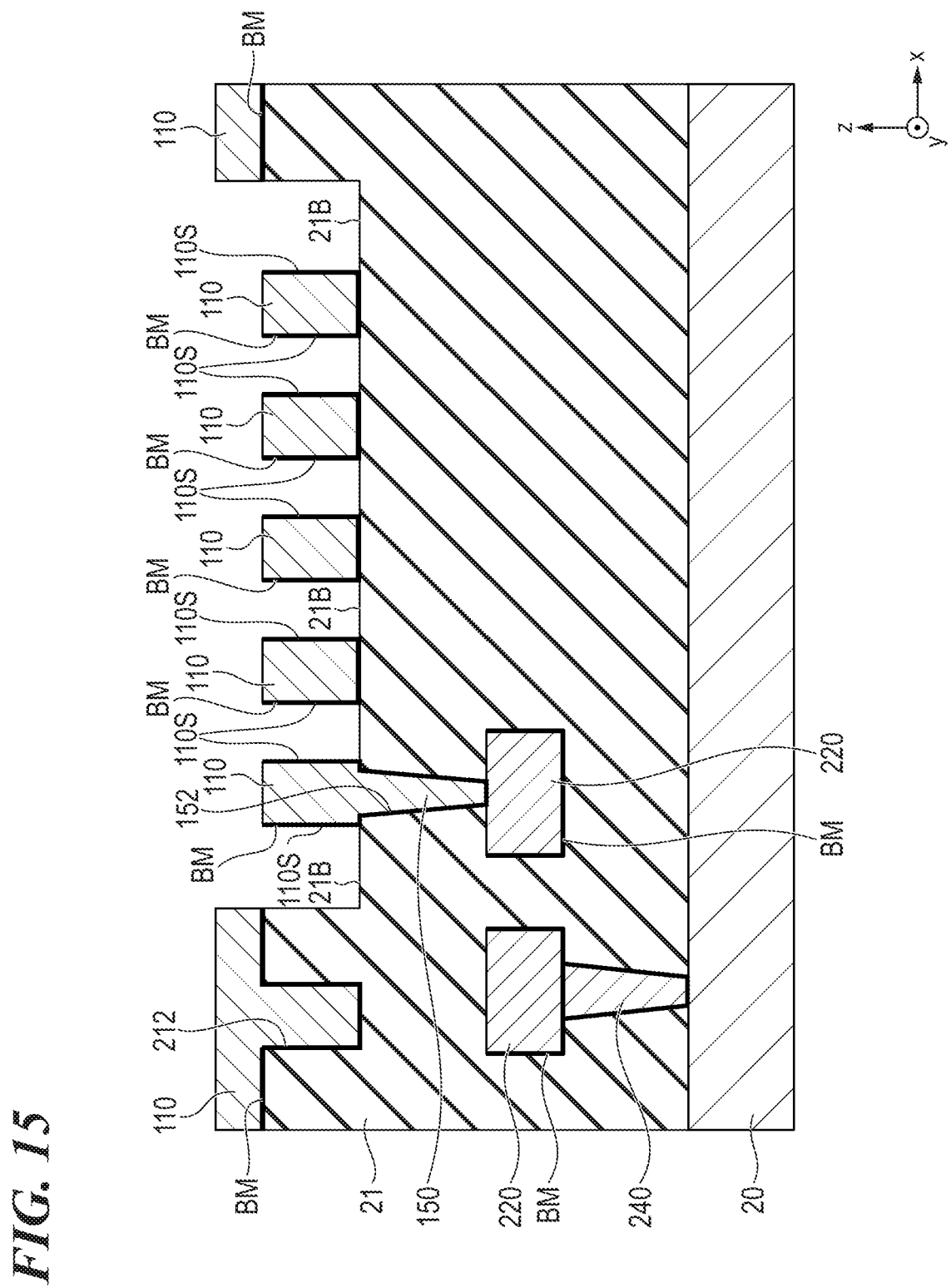
FIG. 15 is a diagram of assistance in explaining the method of manufacturing the semiconductor device according to the first embodiment.

Then, a part of the insulating layer 21 directly beneath the opening 91 is removed by anisotropic etching using a gas with selectivity that allows for removing the insulating layer 21, whereas not removing the conductor 110. As shown in FIG. 15, the etching is performed until a side surface 110S of the conductor 110, with which the inside of the recessed portions 112 is filled, becomes fully exposed. In FIG. 15, a reference sign "21B" is used to refer to a bottom surface of a recessed portion formed in the insulating layer 21 by the etching. The bottom surface is also referred to as a "bottom surface 21B." In the present embodiment, the above-described etching is performed such that a level of the bottom surface 21B becomes the same as a level of a lower end of the conductor 110.

As described above, the exposure step is a step of removing the part of the insulating layer 21 to cause the side surface 110S of the conductor 110 (the first conductor) to be exposed. With the exposure step completed, the etching mask 90 is removed from the surface of the insulating layer 21.

Figure 16:
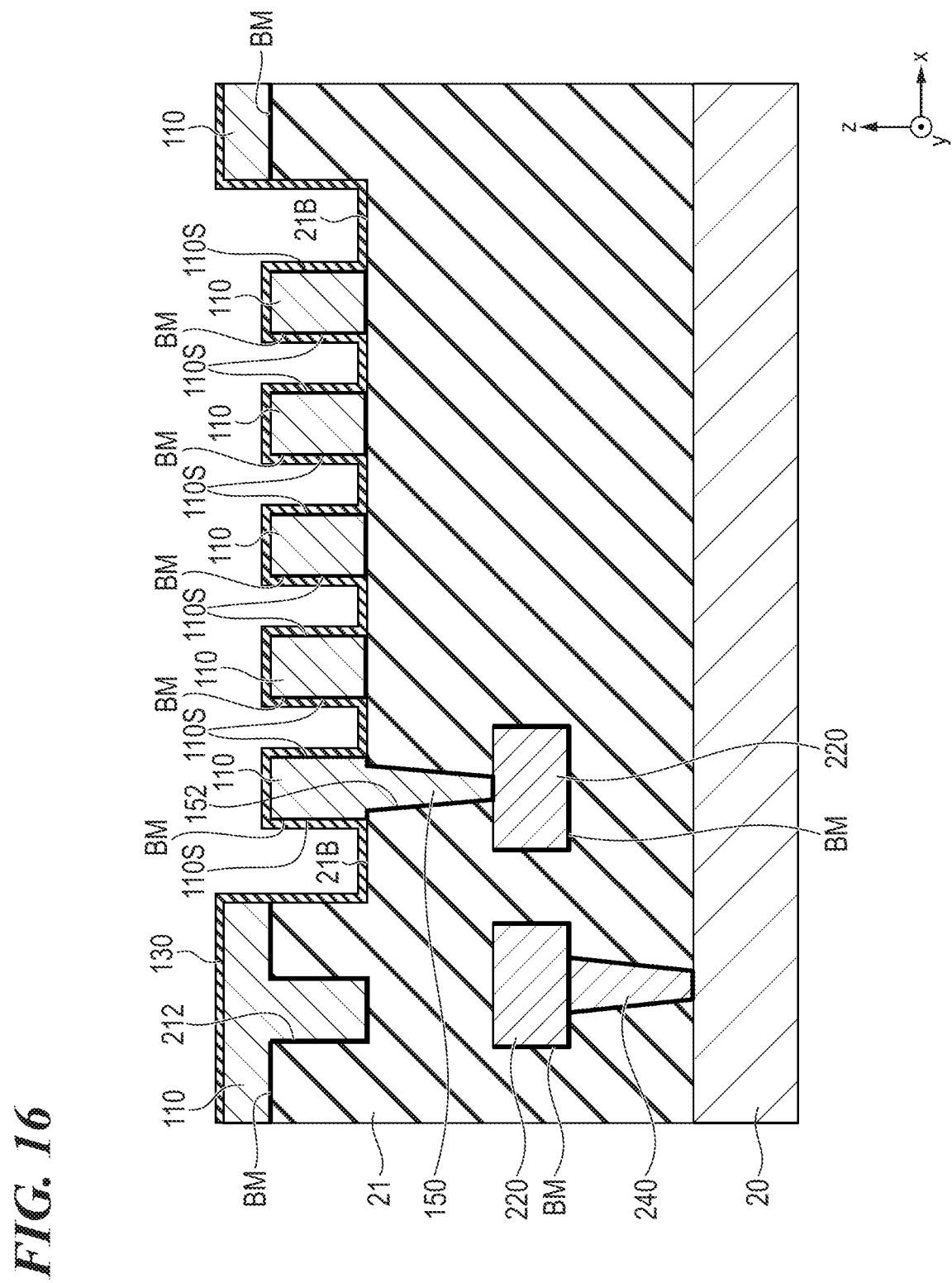
FIG. 16 is a diagram of assistance in explaining the method of manufacturing the semiconductor device according to the first embodiment.

<Insulating Film Formation Step> In an insulating film formation step subsequent to the exposure step, the insulating film 130 is formed by, for example, CVD such that it covers the whole surface of the insulating layer 21 including the conductor 110. FIG. 16 shows a state where formation of the insulating film 130 has been completed. In the state in FIG. 16, the surface of the conductor 110, that is, the surface including the side surface 110S caused to be exposed in the exposure step, is fully covered with the insulating film 130.

Figure 17:
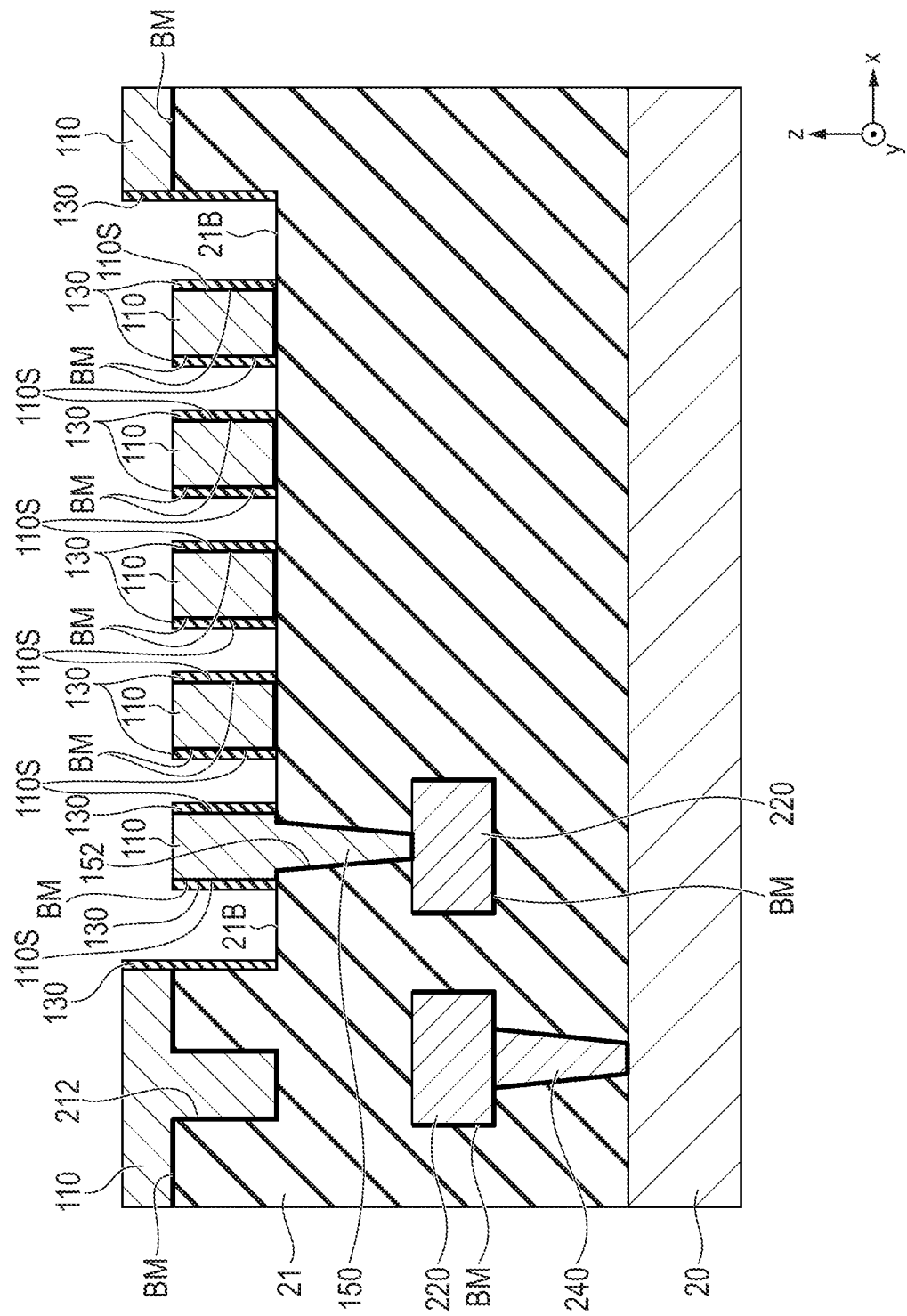
FIG. 17 is a diagram of assistance in explaining the method of manufacturing the semiconductor device according to the first embodiment.

Then, a portion of the insulating film 130 covering the bottom surface 21B and a portion of the insulating film 130 covering a top surface of the conductor 110 are both removed by, for example, RIE. FIG. 17 shows a state where the insulating film is partly removed in this manner. As shown in the figure, only a part of the insulating film 130 covering the side surface of each portion (that is, a surface perpendicular to the surface of the substrate 20) remains.

As described above, the insulating film formation step is a step of forming an insulating film 130S on the exposed side surface 110S of the conductor 110 (the first conductor).

Figure 18:
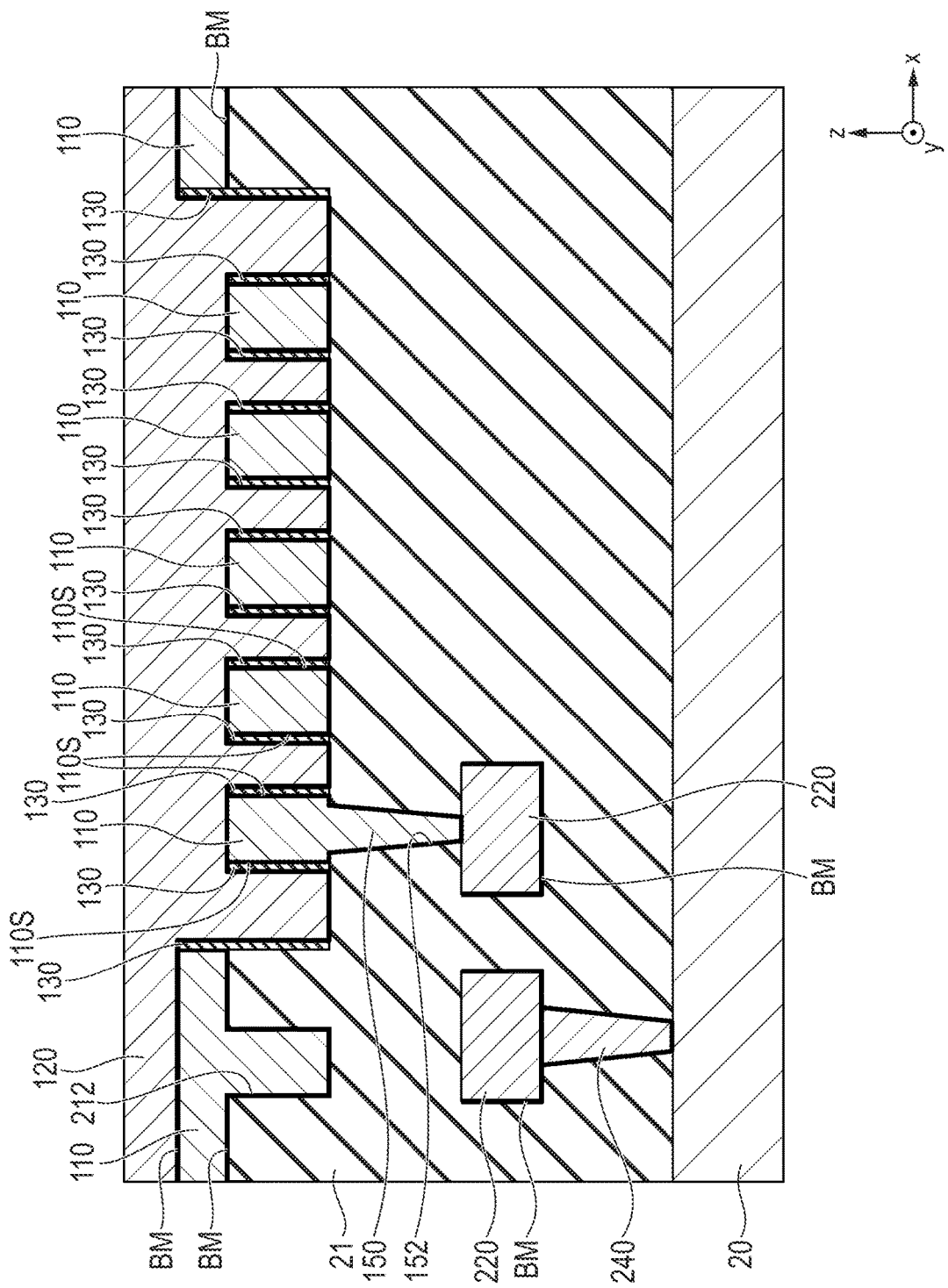
FIG. 18 is a diagram of assistance in explaining the method of manufacturing the semiconductor device according to the first embodiment.

<Second Conductor Formation Step> In a second conductor formation step subsequent to the insulating film formation step, a layer of the barrier metal BM is first formed such that it covers the whole surface of the insulating layer 21 including the conductor 110, the insulating film 130, etc. Then, a layer of the conductor 120 is formed such that it covers the whole of the barrier metal BM. The barrier metal BM and the conductor 120 are formed by, for example, CVD. FIG. 18 shows a state where the second conductor formation step has been completed. As shown in the figure, with the second conductor formation step completed, a periphery of the conductor 110 with the insulating film 130 formed on the side surface 110S is fully embedded in the conductor 120 with the barrier metal BM in between. A part of the conductor 120 is formed at a position facing the conductor 110 with the insulating film 130 in between. The conductor 120 formed at that position finally remains as the conductor 120 shown in FIG. 7, etc.

As described above, the second conductor formation step is a step of forming the conductor 120 (the second conductor) at the position facing the conductor 110 (the first conductor) with the insulating film 130 in between.

Figure 19:
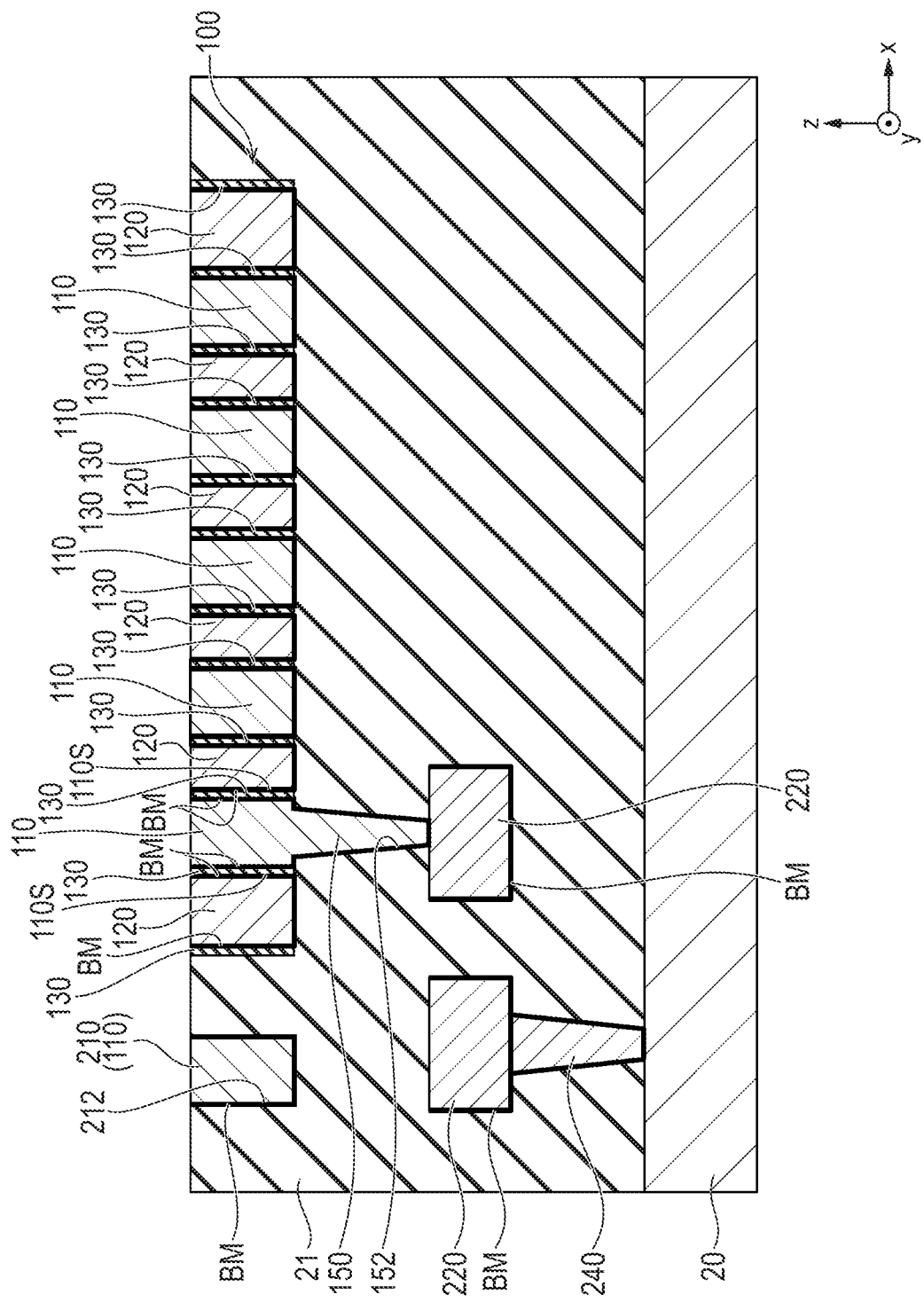
FIG. 19 is a diagram of assistance in explaining the method of manufacturing the semiconductor device according to the first embodiment.

<Polishing Step> In a polishing step subsequent to the second conductor formation step, a part of the conductor 110 and a part of the conductor 120 formed on an upper side of the insulating layer 21 are polished and removed by, for example, CMP (Chemical Mechanical Polishing). The polishing is performed until the top surface of the insulating layer 21 becomes exposed. FIG. 19 shows a state where the polishing step has been completed. With the polishing step performed, the whole of the conductor 120 faces the conductor 110 with the insulating film 130 in between.

Figure 20:
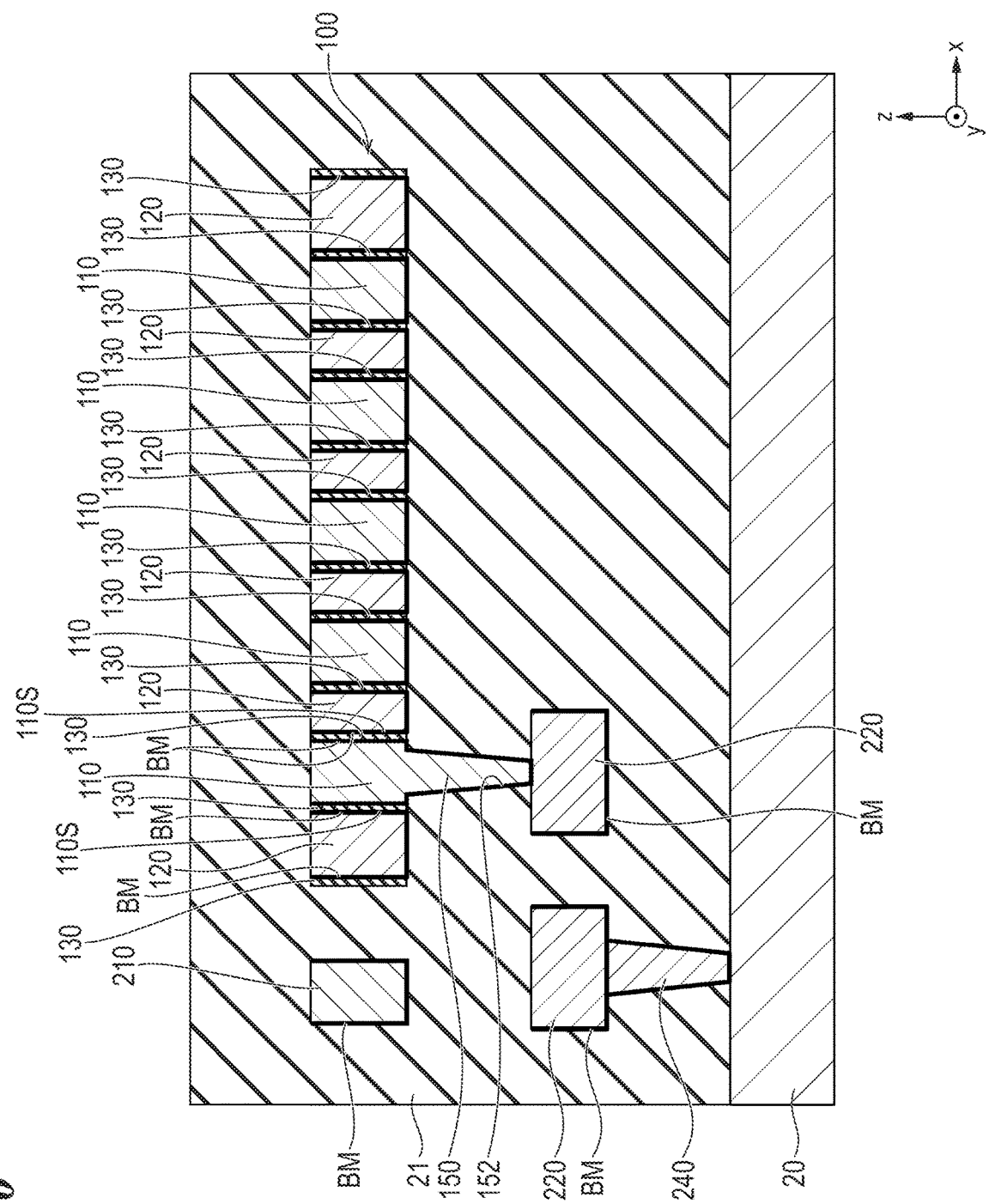
FIG. 20 is a diagram of assistance in explaining the method of manufacturing the semiconductor device according to the first embodiment.

<Upper Layer Formation Step> In an upper layer formation step subsequent to the polishing step, the insulating layer 21 is additionally formed such that it covers the whole surface polished in the polishing step from above. The added insulating layer 21 corresponds to an upper-layer portion of the insulating layer 21 shown in FIG. 4. FIG. 20 shows a state where the upper layer formation step has been completed. With the upper layer formation step completed, the conductor 110 and the conductor 120, which constitute the capacitive element 100, are fully embedded within the insulating layer 21. In the insulating layer 21 shown in FIG. 8, the portion additionally formed in the upper layer formation step corresponds to the "second portion" according to the present embodiment. In other words, in the upper layer formation step, the second portion of the insulating layer 21 is formed on an upper side of the conductor 110 and the conductor 120.

<Contact Formation Step> In a contact formation step subsequent to the upper layer formation step, a contact hole is formed in a portion of the insulating layer 21 directly above the conductor 120 and the contact 230 is formed inside the contact hole with the barrier metal BM in between. The barrier metal BM and the contact 230 are formed by, for example, CVD. The capacitive element 100 shown in FIG. 8, etc., is thus completed.

As described above, the method of manufacturing the semiconductor device 10 includes the step of forming the insulating layer 21 covering the surface of the substrate 20, the step of forming the conductor 110 within the insulating layer 21, the step of removing the part of the insulating layer 21 to cause the side surface of the conductor 110 (specifically, the side surface of the first conductor including the barrier metal BM) to be exposed, the step of forming the insulating film 130 on the exposed side surface of the conductor 110, and the step of forming the conductor 120 at the position facing the conductor 110 with the insulating film 130 in between. According to the method, the insulating film 130, which is formed on the side surface of the conductor 110 by CVD film formation, can be in the form of a considerably thin film as compared with the thicknesses of the conductor 110 and the conductor 120. As a result, d in the expression (1) is reduced, which makes it possible to increase the capacitance of the capacitive element 100 per unit of area more than ever before.

The material of the insulating film 130, which can be freely changed by changing gas species for CVD, can be selected as appropriate in accordance with a required value of capacitance. In other words, unlike the comparative example described with reference to FIG. 25, a material with a higher relative permittivity than that of the insulating layer 21 can be freely selected without the necessity of using the insulating layer 21 as an interelectrode insulating film.

In the mask formation step shown in FIG. 13, a formation position of the opening 91 in the etching mask 90 would be offset from a target position in the x-direction or the y-direction. However, even if such a position offset occurs, the area of the face-to-face portions of the conductor 110 and the conductor 120 does not change and the thickness of the insulating film 130 does not change, either. In other words, according to the manufacturing method described above, even if the position offset of the opening 91 or the like occurs, the capacitance of the capacitive element 100 can be ensured with a high accuracy in accordance with an initial designed value by virtue of self-alignment.

In the first conductor formation step shown in FIG. 12, the conductor 110 is formed inside the recessed portions 112 and, simultaneously, the conductor 110 is likewise formed inside the recessed portion 212 at the same level. The conductor 110 formed within the recessed portion 212 finally becomes a wiring layer, i.e., the conductor 210. The conductor 210, including the barrier metal BM covering a part of the outer peripheral surface thereof, corresponds to a "third conductor" according to the present embodiment.

As seen from the above, in the first conductor formation step, the conductor 210 (the third conductor) is formed within the insulating layer 21 at the same level as the conductor 110 (the first conductor) of the capacitive element 100. The "same level" in the above description refers to a position where the conductor 110 of the capacitive element 100 and the conductor 210 at least partly overlap when seen along a direction parallel with the surface of the substrate 20. For example, the lower end of the conductor 110 and the lower end of the conductor 210 may be at the same level as in the present embodiment or may be at levels different from each other. In other words, it is only necessary that a part of the conductor 110 is at the same level as a part of the conductor 210 in the z-direction.

The semiconductor device 10 according to the present embodiment thus has a configuration where the capacitive element 100 is disposed within the insulating layer 21 at a portion that is an empty space with no wiring line (conductor 210) formed at a specific level. By virtue of the capacitive element 100 being not only downsized but also disposed in the empty space, the semiconductor device 10 is further downsized.

The capacitive element 100 is formed at the same level as a wiring line, i.e., the conductor 210, and at a position spaced from the conductor 210 along the x-direction. This makes it possible to sufficiently reduce a capacitance component generated between the conductor 210 and the capacitive element 100. In such a configuration, the capacitance component generated between the capacitive element 100 and the conductor 210 is prevented from being adverse to the configuration and location of the capacitive element 100.

A second embodiment will be described. A difference from the first embodiment will be mainly described hereinbelow and description on a point common to the first embodiment will be omitted, if necessary.

Figure 21:
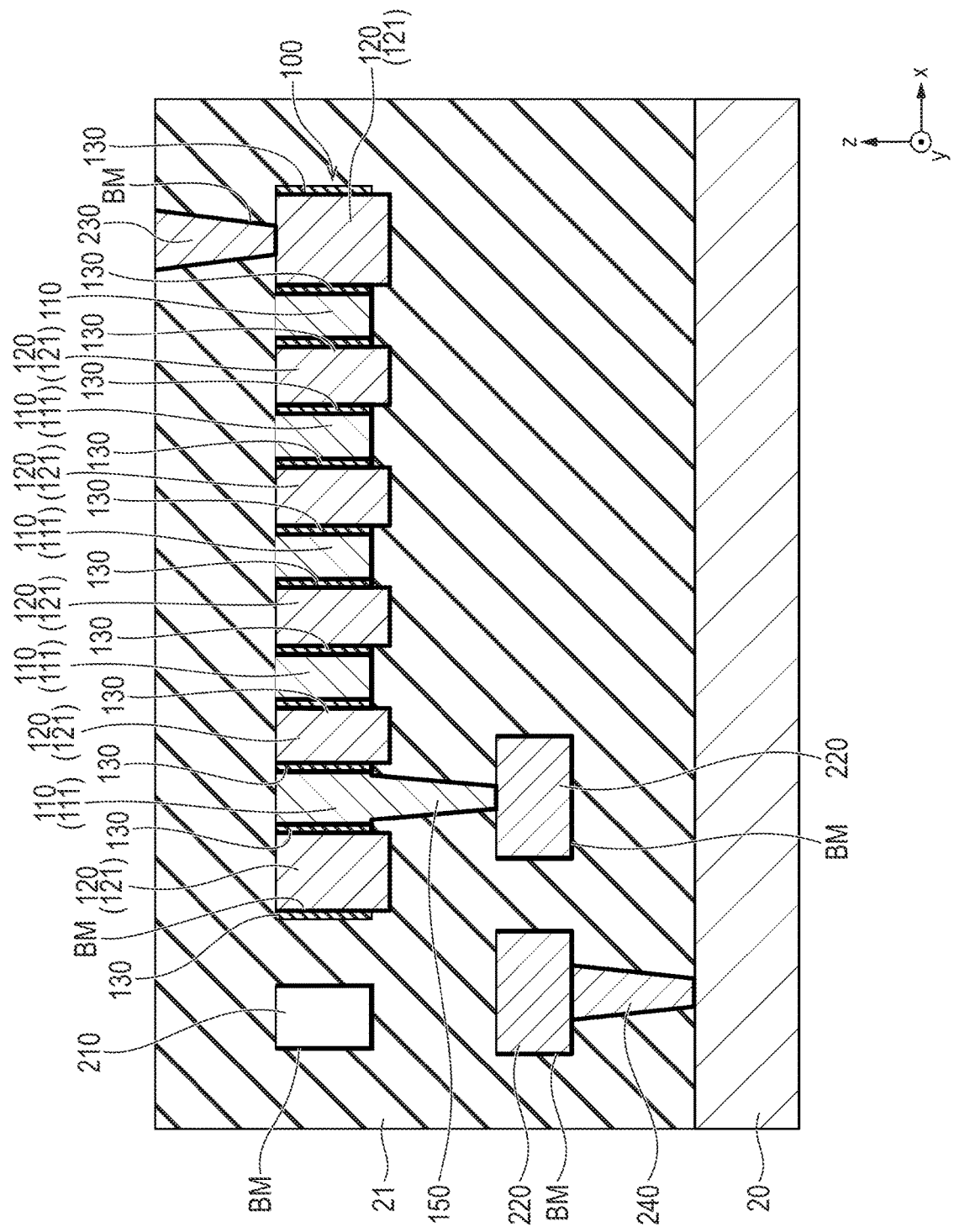
FIG. 21 is a cross sectional view showing a configuration of a semiconductor device according to a second embodiment.

FIG. 21 shows a configuration of the capacitive element 100 in the present embodiment in the same point of sight and manner as in FIG. 8. As shown in FIG. 21, in the present embodiment, the conductor 120 (the second conductor) extends toward the substrate 20 to a deeper position than the conductor 110 (the first conductor). In other words, the conductor 120 is provided at a position closer to the substrate 20 in the z-direction than the conductor 110.

Out of the plurality of linear portions 111 shown in a cross section in FIG. 21, one in contact with the contact 150 corresponds to a "fifth portion" of the conductor 110 in the present embodiment. Out of the plurality of linear portions 111 shown in the cross section in FIG. 21, one adjacent to the above-described fifth portion in the x-direction with the linear portion 121 in between corresponds to a "sixth portion" of the conductor 110 in the present embodiment. The sixth portion is provided at a shallower position in the z-direction than the linear portion 121 of the conductor 120.

Figure 22:
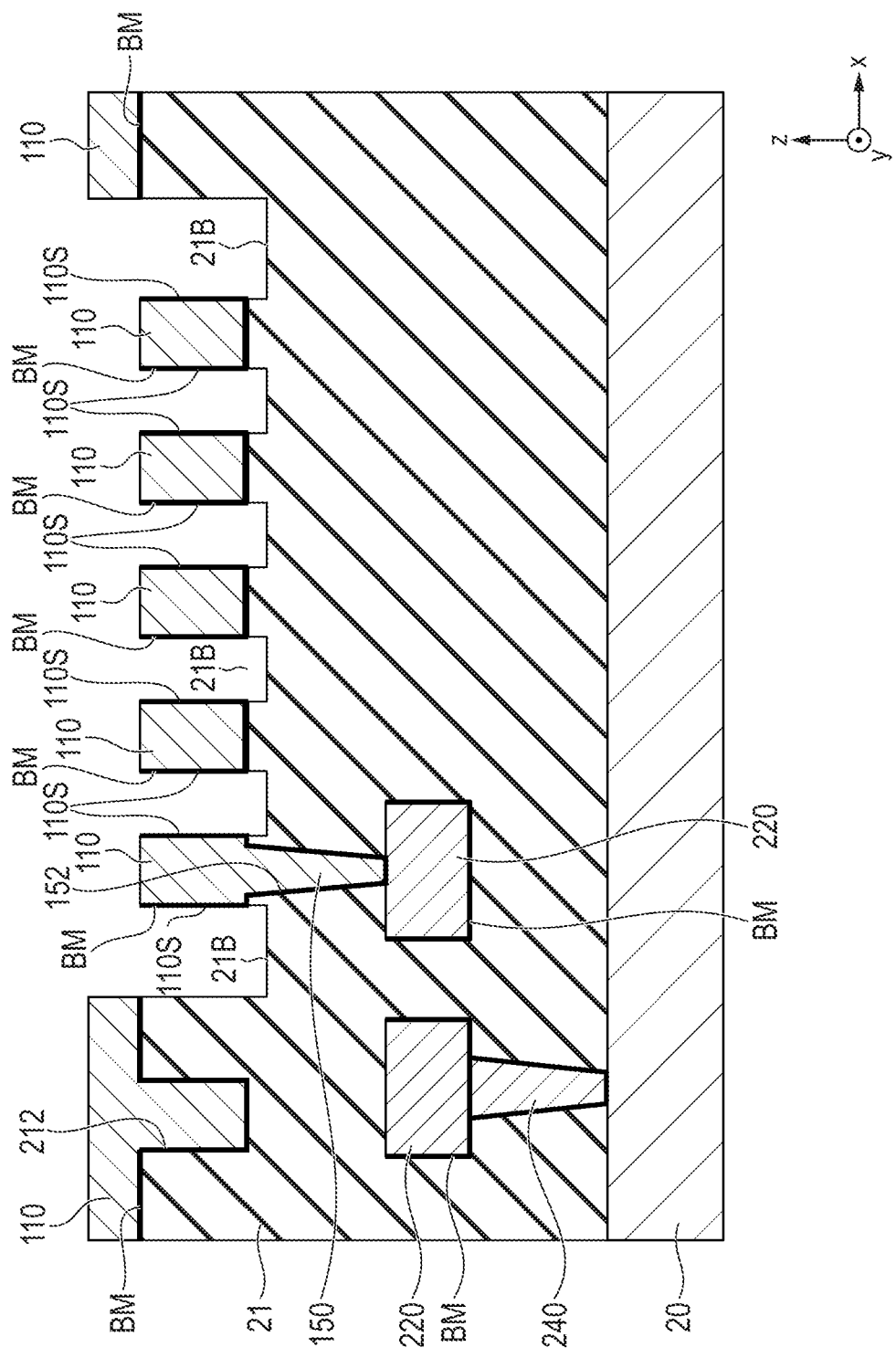
FIG. 22 is a diagram of assistance in explaining a method of manufacturing the semiconductor device according to the second embodiment.

FIG. 22 shows a state after, out of the manufacturing steps for forming the capacitive element 100 of the present embodiment, the exposure step is performed. As is apparent from comparison between FIG. 22 and FIG. 15 (the first embodiment), in the exposure step according to the present embodiment, etching of the insulating layer 21 is performed until a level of the bottom surface 21B becomes further lower than the level of the lower end of the conductor 110. In other words, the insulating layer 21 is removed to reach a position deeper toward the substrate 20 than the conductor 110 (the first conductor). The subsequent steps are the same as those in the first embodiment In the exposure step (FIG. 15) of the first embodiment, if etching of the insulating layer 21 fails to be accurately performed with the level of the bottom surface 21B being higher than the level of the lower end of the conductor 110, the area of the face-to-face portions of the conductor 110 and the conductor 120 is reduced. As a result, the capacitance of the capacitive element 100 becomes smaller than the initial designed value. As seen from the above, the configuration of the first embodiment would cause the capacitance of capacitive element 100 to vary depending on the accuracy of etching of the insulating layer 21.

In contrast, in the exposure step (FIG. 22) of the present embodiment, etching of the insulating layer 21 is performed until the level of the bottom surface 21B becomes further lower than the level of the lower end of the conductor 110 as described above. Even if the etching of the insulating layer 21 fails to be accurately performed with the level of the bottom surface 21B varying up and down with respect to the position in FIG. 22, the area of the face-to-face portions of the conductor 110 and the conductor 120 does not vary. As seen from the above, the configuration of the present embodiment makes it possible to reduce a variation in capacitance attributed to the accuracy of etching of the insulating layer 21, so that the initial designed value of the capacitance of the capacitive element 100 can be accurately ensured.

A third embodiment will be described. A difference from the first embodiment will be mainly described hereinbelow and description on a point common to the first embodiment will be omitted, if necessary.

FIG. 23 shows a configuration of the capacitive element 100 in the present embodiment in the same point of sight and manner as in FIG. 7. As shown in FIG. 23, in the capacitive element 100 of the present embodiment, the conductor 120 is divided into a plurality of conductors 120, which are disposed at positions inside the conductor 110. In other words, the conductor 110 is disposed such that it surrounds peripheries of the plurality of conductors 120. There are a plurality of contacts 230 corresponding one-to-one to the conductors 120. Such a configuration can also achieve the same effects as described in the first embodiment.

In the present embodiment, the conductors 120 (the second conductor) may each extend toward the substrate 20 to a deeper position than the conductor 110 (the first conductor) as in the second embodiment.

A fourth embodiment will be described. A difference from the first embodiment will be mainly described hereinbelow and description on a point common to the first embodiment will be omitted, if necessary.

Figure 24:
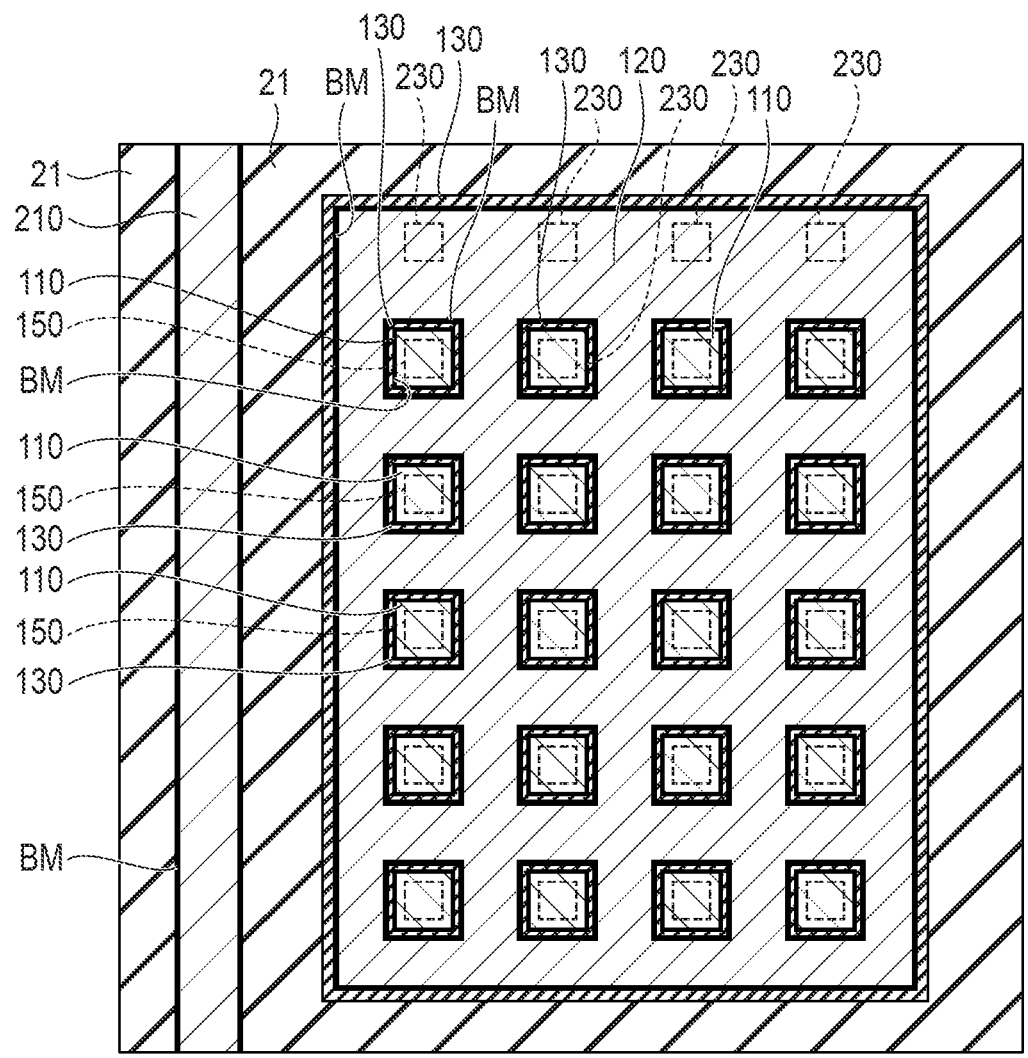
FIG. 24 is a cross sectional view showing a configuration of a semiconductor device according to a fourth embodiment.

FIG. 24 shows a configuration of the capacitive element 100 in the present embodiment in the same point of sight and manner as in FIG. 7. As shown in FIG. 24, in the capacitive element 100 of the present embodiment, the conductor 110 is divided into a plurality of conductors 110, which are disposed at positions inside the conductor 120. In other words, inversely with the above-described third embodiment, the conductor 120 is disposed such that it surrounds peripheries of the plurality of conductors 110. There are a plurality of contacts 150 corresponding one-to-one to the conductors 110. Such a configuration can also achieve the same effects as described in the first embodiment.

In the present embodiment, the conductors 120 (the second conductor) may each extend toward the substrate 20 to a deeper position than the conductor 110 (the first conductor) as in the second embodiment.

The description is made above on the example where the semiconductor device 10 is a non-volatile semiconductor storage configured as a NAND flash memory. However, the configuration described above is applicable not only to a semiconductor storage but also to other types of devices.

The present embodiments are described above with reference to specific examples. However, the present disclosure is not limited to these specific examples. Configurations provided by making an alteration to these specific examples by those skilled in the art, if necessary, also fall within the scope of the present disclosure as long as they have a feature of the present disclosure. The components of the above-described specific examples and the locations, conditions, shapes, etc., thereof are not limited to those described by way of example and may be altered, if necessary. The combinations of the components of the above-described specific examples may be changed, if necessary, as long as no technical inconsistency arises.

What is claimed is:

1. A semiconductor device comprising:
   an insulating layer provided on an upper side of a substrate;
   a first conductor provided within the insulating layer;
   a second conductor provided within the insulating layer and facing the first conductor in a first direction parallel with a surface of the substrate; and
   a first insulating film provided between the first conductor and the second conductor, wherein
   a thickness of the first insulating film in the first direction is smaller than both of a thickness of the first conductor in the first direction and a thickness of the second conductor in the first direction,
   a relative permittivity of the first insulating film is higher than a relative permittivity of the insulating layer, and
   the first conductor and the second conductor extend in a second direction intersecting the first direction and parallel with the substrate, and
   wherein
   the second conductor comprises a first portion and a second portion adjacent to the first portion in the first direction,
   the first portion and the second portion extend in the second direction,
   the first conductor is provided between the first portion and the second portion,
   the first insulating film comprises a third portion and a fourth portion,
   the third portion is provided between the first conductor and the first portion,
   the fourth portion is provided between the first conductor and the second portion,
   a thickness of the third portion in the first direction is smaller than both of the thickness of the first conductor in the first direction and a thickness of the first portion in the first direction, and
   a thickness of the fourth portion in the first direction is smaller than both of the thickness of the first conductor in the first direction and a thickness of the second portion in the first direction.

2. The semiconductor device according to claim 1, wherein the second conductor is provided at a position closer to the substrate than the first conductor in a third direction intersecting both the first direction and the second direction.

3. The semiconductor device according to claim 2, wherein
   the first conductor comprises a fifth portion and a sixth portion adjacent to the fifth portion in the first direction with the second conductor sandwiched in between,
   the fifth portion and the sixth portion extend in the second direction,
   the fifth portion is in contact with a contact, and
   the sixth portion is provided at a shallower position than the second conductor in the third direction.

4. The semiconductor device according to claim 1, further comprising a third conductor provided within the insulating layer, wherein
   a part of the first conductor is at a same position as a part of the third conductor in a third direction intersecting both the first direction and the second direction.

5. The semiconductor device according to claim 1, further comprising a contact extending in a third direction intersecting both the first direction and the second direction, wherein
   the first conductor is formed integrally with the contact.

6. The semiconductor device according to claim 5, wherein a position of an end portion of the contact toward the substrate is closer to the substrate than a position of an end portion of the second conductor toward the substrate.

7. The semiconductor device according to claim 1, wherein a thickness of the first conductor in a third direction intersecting both the first direction and the second direction is larger than a minimum distance between the first conductor and the second conductor.

8. The semiconductor device according to claim 1, wherein the first conductor and the second conductor are in contact with the first insulating film.

9. The semiconductor device according to claim 1, wherein the first insulating film comprises one of hafnium oxide, tantalum oxide, and silicon nitride.

10. The semiconductor device according to claim 1, further comprising a memory cell and a driver comprising a transistor for driving the memory cell, wherein
    the transistor is provided on the substrate, and
    a distance between the substrate and the memory cell is larger than a distance between the substrate and the first conductor.

11. A semiconductor device comprising:
    an insulating layer provided on an upper side of a substrate;
    a first conductor provided within the insulating layer;
    a second conductor provided within the insulating layer and facing the first conductor in a first direction parallel with a surface of the substrate;
    a first insulating film provided between the first conductor and the second conductor, wherein
    a thickness of the first insulating film in the first direction is smaller than both of a thickness of the first conductor in the first direction and a thickness of the second conductor in the first direction,
    a relative permittivity of the first insulating film is higher than a relative permittivity of the insulating layer, and
    the first conductor and the second conductor extend in a second direction intersecting the first direction and parallel with the substrate, and a contact extending in a third direction intersecting both the first direction and the second direction, wherein the first conductor is formed integrally with the contact, wherein a position of an end portion of the contact toward the substrate is closer to the substrate than a position of an end portion of the second conductor toward the substrate.

12. A semiconductor device comprising:

an insulating layer provided on an upper side of a substrate;

a first conductor provided within the insulating layer;

a second conductor provided within the insulating layer and facing the first conductor in a first direction parallel with a surface of the substrate; and a first insulating film provided between the first conductor and the second conductor, wherein a thickness of the first insulating film in the first direction is smaller than both of a thickness of the first conductor in the first direction and a thickness of the second conductor in the first direction, a relative permittivity of the first insulating film is higher than a relative permittivity of the insulating layer, and the first conductor and the second conductor extend in a second direction intersecting the first direction and parallel with the substrate, wherein the second conductor is provided at a position closer to the substrate than the first conductor in a third direction intersecting both the first direction and the second direction, wherein the first conductor comprises a fifth portion and a sixth portion adjacent to the fifth portion in the first direction with the second conductor sandwiched in between, the fifth portion and the sixth portion extend in the second direction, the fifth portion is in contact with a contact, and the sixth portion is provided at a shallower position than the second conductor in the third direction.

* * * * *